(12) United States Patent
Abe et al.

(10) Patent No.: US 6,284,670 B1
(45) Date of Patent: Sep. 4, 2001

(54) METHOD OF ETCHING SILICON WAFER AND SILICON WAFER

(75) Inventors: Yoshitsugu Abe, Anjo; Hiroshi Tanaka, Toyokawa; Atsushi Sakaida, Nagoya; Toshihisa Taniguchi, Handa; Tsuyoshi Fukada, Aichi-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/120,803

(22) Filed: Jul. 23, 1998

(30) Foreign Application Priority Data

Jul. 23, 1997 (JP) .................................. 9-197054
Jun. 5, 1998 (JP) ................................ 10-157916
Jun. 5, 1998 (JP) ................................ 10-157917

(51) Int. Cl.$^7$ ............................................. H01L 21/3063
(52) U.S. Cl. ..................... 438/745; 438/749; 438/750; 438/753; 438/756; 257/419; 257/420
(58) Field of Search .................................. 438/745, 746, 438/748, 750, 753, 531; 129/621.1; 73/720, 727; 257/419

(56) References Cited

U.S. PATENT DOCUMENTS

| | | |
|---|---|---|
| 4,618,397 | 10/1986 | Shimizu et al. ............... 156/628 |
| 4,664,762 | 5/1987 | Hirata . |
| 4,808,549 * | 2/1989 | Mikkor et al. ................. 438/53 |
| 4,889,590 | 12/1989 | Tucker et al. ................. 156/647 |
| 4,995,953 | 2/1991 | Yee . |
| 4,996,627 | 2/1991 | Zias et al. .................... 361/283 |
| 5,071,510 | 12/1991 | Findler et al. ................ 156/647 |
| 5,167,778 * | 12/1992 | Kaneko et al. ............. 204/129.65 |
| 5,223,086 | 6/1993 | Terada et al. ................. 156/651 |
| 5,231,301 | 7/1993 | Peterson et al. ............... 257/489 |
| 5,242,533 | 9/1993 | Trah et al. ................... 156/628 |

(List continued on next page.)

FOREIGN PATENT DOCUMENTS

| | | |
|---|---|---|
| 567 075 | 10/1993 | (EP) . |
| 59-013377 | 1/1984 | (JP) . |
| 60-013314 | 4/1985 | (JP) . |
| 62-060270 | 3/1987 | (JP) . |
| 63-56962 | 3/1988 | (JP) . |
| 1-291429 | 11/1989 | (JP) . |
| 2-278772 | 11/1990 | (JP) . |
| 3-037749 | 6/1991 | (JP) . |
| 4-239184 | 8/1992 | (JP) . |
| 5-196525 | 8/1993 | (JP) . |
| 5-66728 | 9/1993 | (JP) . |
| 6-260660 | 9/1994 | (JP) . |
| 7-037856 | 2/1995 | (JP) . |
| 8-264504 | 10/1996 | (JP) . |

OTHER PUBLICATIONS

Jackson, et al., "An Electrochemical P–N Junction Etch-Stop for the Formation of Silicon Microstructures", IEEE Electron Device Letters, vol. EDL–2, No. 2, (Feb. 1981), pp 44–45.

(List continued on next page.)

*Primary Examiner*—Benjamin L. Utech
*Assistant Examiner*—Lan Vinh
(74) *Attorney, Agent, or Firm*—Pillsbury Winthrop LLP

(57) ABSTRACT

After an Si wafer is anisotropically etched through an etching mask having an opening in an anisotropically etching solution, an etching face of the Si wafer emerged by the anisotropic etching is subjected to anodic oxidation by applying a positive voltage for anodic oxidation on the Si wafer. As a result, the etching face of the Si wafer is isotropically etched due to the anodic oxidation in the anisotropic etching solution. By the isotropic etching thus performed, a sharp corner formed at an end portion of a recess portion formed in the Si wafer by the anisotropic etching, is rounded. Because the isotropic etching reaction progresses very slowly in comparison with the anisotropic etching, control of the etching can be made easy and accurately. As a result, the thickness of the diaphragm can be prevented from being dispersed.

49 Claims, 30 Drawing Sheets

U.S. PATENT DOCUMENTS

| | | | |
|---|---|---|---|
| 5,289,721 | * | 3/1994 | Tanizawa et al. .................. 73/727 |
| 5,296,730 | | 3/1994 | Takano et al. .................. 257/417 |
| 5,385,652 | * | 1/1995 | Wang et al. .................. 204/129.65 |
| 5,387,316 | | 2/1995 | Pennell et al. .................. 156/647 |
| 5,445,718 | | 8/1995 | Wang .................. 204/129.1 |
| 5,514,898 | | 5/1996 | Hartauer .................. 438/53 |
| 5,525,549 | * | 6/1996 | Fukada et al. .................. 438/53 |
| 5,631,198 | * | 5/1997 | Hartauer .................. 438/53 |
| 5,643,803 | | 7/1997 | Fukada et al. . |
| 5,761,957 | * | 6/1998 | Oba et al. .................. 73/727 |
| 5,804,090 | * | 9/1998 | Iwasaki et al. .................. 216/99 |
| 6,020,618 | * | 2/2000 | Sakai .................. 257/419 |

OTHER PUBLICATIONS

Kloeck, et al., "Study of Electrochemical Etch–Stop for High–Precision Thickness Control of Silicon Membranes", IEEE Transactions on Electron Devices, vol. 36, No. 4, (Apr. 1989), pp 663–669.

Kim, et al., "Temperature Sensitivity in Silicon Piezoresistive Pressure Transducers", IEEE Transactions on Electron Devices, vol. ED–30, No. 7, (Jul. 1983), pp 802–810.

Sarro, et al., "Silicon Cantilever Beams Fabricated by Electrochemically Controlled Etching for Sensor Applications", Journal of the Electrochemical Soceity, (Aug. 1986), pp 1724–1729.

Patent Abstracts of Japan, vol. 011, No. 249, (E–532) Aug. 13, 1987, & JP–A–62 061 374, Mar. 18, 1987.

Sarro et al: "Silicon Cantilever Beams Fabricated by Electrochemically Controlled Etching for Sensor Applications", Journal of the Electrochemical Society, vol. 133, No. 8, Aug. 1986, pp. 1724–1729.

Journal of Nippondenso Technical Disclosure 88–002, 1/1993.

* cited by examiner

METHOD OF ETCHING SILICON WAFER AND SILICON WAFER

CROSS REFERENCE TO RELATED APPLICATION

This application is based upon and claims the benefit of priority of Japanese Patent Applications No. H.9-197054 filed on Jul. 23, 1997, No. H.10-157916 filed on Jun. 5, 1998, and No. H.10-157917 filed on Jun. 5, 1998, the contents of which are incorporated herein by reference.

BACKGROUND OF THE INVENTION

1. Field of the Invention

The present invention relates to a method of etching silicon (Si) wafer preferable in forming an Si diaphragm used for a semiconductor pressure sensor, a semiconductor acceleration sensor or the like and relates to an Si wafer having a diaphragm of an octagonal shape.

2. Description of Related Art

An explanation will be given of a conventional method of forming an Si diaphragm used for a semiconductor pressure sensor, a semiconductor acceleration sensor or the like in reference to FIGS. 56 and 57. First, as shown in FIG. 56, gages (strain gages) 2 having a predetermined shape are formed on a lower face of an Si wafer 1. Further, an etching mask 3 composed of $SiO_2$ or SiN is formed on an upper face of the Si wafer 1. Successively, as shown in FIG. 57, the lower face side of the Si wafer 1 is pasted on a ceramic substrate 5 via a protecting member 4 of wax or the like. Thereby, the lower face side of the Si wafer 1 is protected.

As shown by FIG. 57, the Si wafer 1 and the ceramic substrate 5 are immersed in an anisotropic etching solution composed of, for example, an aqueous solution of KOH stored in a vessel 6 to thereby carry out chemical etching. In this case, a plurality of sheets of the Si wafers 1 (as well as the ceramic substrates 5) are set in a carrier 8 and immersed into the anisotropic etching solution 7 along with the carrier 8.

When the Si wafer 1 is immersed into the anisotropic etching solution 7, as shown by two-dotted chain lines in FIG. 56, etching faces in correspondence with opening portions 3a of the etching mask 3 are dissolved, and recess portions 9 are formed. Further, the bottom portions of the recess portions 9 constitute a diaphragm 9a. In this case, the anisotropic etching is carried out by the anisotropic etching solution 7 and accordingly, sharp corners are formed at end portions 9b of the diaphragm 9a. When the end portions 9b of the diaphragm 9a are sharp corners, the pressure resistant strength of the diaphragm 9a is lowered.

Hence, conventionally, the Si wafer 1 having the recess portions 9 formed is immersed in an isotropic etching solution composed of, for example, an acid-base etching solution and the inner faces of the recess portions 9 are isotropically etched by which a processing of rounding the end portions of the diaphragm 9a is executed.

However, the isotropic etching processing is a diffusion controlled reaction and therefore, control of the reaction is difficult. Further, in the acid-base anisotropic etching solution, ageing change of composition is considerable. Therefore, there arises a problem where the depth dimension of the recess portion 9 formed in the Si wafer 1, that is, the thickness dimension of the formed Si diaphragm 9a is significantly dispersed. Furthermore, there causes a drawback where the inner side bottom face of the recess portion 9, that is, the surface of the Si diaphragm 9a is considerably roughened or a drawback where dimension D1 of the diaphragm specified in FIG. 17 is varied. This is because, when a face having crystal orientation of (110) of the Si wafer 1 (hereinafter, referred to as (110) face) is etched by the anisotropic etching solution 7, impurities such as metal ions (for example, Pb) included in the anisotropic etching solution 7 by a very small amount are adsorbed on the etching face of the Si wafer 1 and the etching rate is varied by masking operation due to the adsorption of impurities.

Further, an example of a diaphragm for a semiconductor pressure sensor is disclosed in Japanese Patent Application Laid-Open No. H.4-119672. According to the example, an Si diaphragm having an octagonal shape is formed by etching an Si wafer having crystal orientation of (110). A specific explanation will be given of a method of forming this Si diaphragm in reference to FIGS. 58 through 65.

First, as shown by FIGS. 58 and 59, an etching mask 102 composed of SiN, $SiO_2$ or the like is formed and patterned on an upper face (left face in FIG. 59) of an Si wafer 101 having crystal orientation of (110). It is to be noted that gages, electrodes or the like having predetermined shapes have previously been formed on a lower face (right face in FIG. 59) of the Si wafer 1. Then, anisotropic etching is carried out by immersing the Si wafer 101 in an alkaline etching solution composed of KOH or the like. Thereby, an Si diaphragm 103 having an octagonal shape shown in FIGS. 60 and 61 is formed.

The Si wafer 101 in a state that the etching mask 102 is removed from the Si wafer 101 which has been finished with etching, is shown in FIGS. 62 through 65. As shown in FIG. 62, the Si diaphragm 103 having an octagonal shape is surrounded by two upper and lower (100) faces, two left and right (111) faces and four (111) faces at oblique positions. Further, as shown in FIG. 63, the two upper and lower (100) faces constitute inclined faces inclined relative to a diaphragm face 103a of the Si diaphragm 103 and an angle of inclination thereof (that is, angle produced by intersecting the (100) face with the diaphragm face 103a) is 45°.

Also, as shown in FIG. 64, the two left and right (111) faces constitute inclined faces inclined relative to the diaphragm face 103a and an angle of inclination thereof (that is, an angle produced by intersecting the left or right (111) face with the diaphragm face 103a) is 35°. By contrast, as shown by FIG. 65, the four (111) faces disposed at the oblique positions constitute faces vertical to the diaphragm face 103a and an angle of inclination thereof (that is, an angle produced by intersecting the four (111) faces at the oblique positions with the diaphragm face 103a) is 90°.

According to the example described above, the two upper and lower (100) faces and the two left and right (111) faces intersect with the diaphragm face 103a by small angles (45°, 35°) whereas the four (111) faces at the oblique positions are orthogonal to the diaphragm face 103a. Accordingly, when excessive pressure is applied on the diaphragm 103, stress is concentrated at portions where the four (111) faces intersect the diaphragm face 103a. Thereby, the above-described portions may be destructed.

SUMMARY OF THE INVENTION

It is an object of the present invention to provide a method of etching an Si wafer capable of promoting accuracy of a depth dimension of a recess portion while being capable of rounding an end portion of an inner side bottom portion of the recess portion formed when the Si wafer is subjected to anisotropic etching. Further, it is another object of the present invention to provide a method of etching an Si wafer capable of promoting smoothness of an inner bottom face of a recess portion formed in etching an Si wafer and accuracy of dimension of the recess portion. It is still another object of the present invention to provide an Si wafer capable of increasing the strength of a diaphragm formed therein by preventing stress from concentrating on a portion of a peripheral edge portion of the diaphragm and a method of manufacturing the diaphragm.

According to a first aspect of the present invention, after carrying out a first step where an Si wafer is anisotropically etched by a predetermined depth, a second step where the Si wafer is subjected to isotropic etching while anodic oxidation is carried out to an etching face emerged in the first step by applying positive voltage for anodic oxidation on the Si wafer. In this case, a corner formed at an end portion of an inner side bottom portion of a recess portion of the Si wafer caused by the anisotropic etching in the first step is rounded by the isotropic etching which is carried out along with the anodic oxidation in the second step. The isotropic etching reaction which is carried out along with the anodic oxidation is not diffusion controlled but reaction rate determining. Further, because the reaction is progressed very slowly in comparison with the anisotropic etching in the first step, that is, the etching rate of the reaction is very small, control of the etching is facilitated. Accordingly, the thickness of the diaphragm can be prevented from being dispersed as less as possible.

In the first step mentioned above, it is preferable that the Si wafer is anisotropically etched while a voltage of a degree capable of carrying out the anisotropic etching on the Si wafer is applied to the Si wafer. In this case, the potential of an etching face of the Si wafer is shifted in the positive direction and a potential difference with respect to a metal ion nobler than Si is reduced. As a result, an impurities such as metal ions or the like are difficult to adsorb onto the etching face. Accordingly, even when the etching face is (110) face, the etching face is smoothed, the smoothness of the inner side bottom face of the recess portion is promoted and at the same time, a dispersion of dimension of a diaphragm can be restrained.

As an anisotropic etching solution used in the first step, KOH can be used, and the isotropic etching can be carried out by using this anisotropic etching solution in the second step. In this case, it is preferable to set high temperature of the anisotropic etching solution in the second step. Thereby, the etching rate in carrying out the isotropic etching can be increased while the anodic oxidation is carried out with respect to the Si wafer by applying positive voltage for anodic oxidation to the Si wafer. As a result, a time period required for rounding the end portion of the inner bottom portion of the recess portion can be shortened.

In the first step, the Si wafer can be subjected to the anisotropic etching while positive voltage of a degree capable of carrying out the anisotropic etching is applied to a P-type layer of an Si wafer having a PN junction. As a result, the etching face is smoothed, the smoothness of the inner side bottom face of the recess portion is promoted and at the same time, a dispersion in dimension of a diaphragm can be restrained. Further, it is preferable that after executing the first step, application of the positive voltage on the P-type layer of the Si wafer is stopped and positive voltage for anodic oxidation is applied onto an N-type layer of the Si wafer, whereby an anodizing step for executing anodic oxidation of the Si wafer at a vicinity of the PN junction, is carried out. In this case, the etching of the Si wafer is automatically stopped at a vicinity of the PN junction by the anodic oxidation and therefore, accuracy of thickness of the diaphragm can be promoted. Further, the Si wafer may be subjected to the isotropic etching by stopping application of positive voltage on the N-type layer of the Si wafer and applying positive voltage for anodic oxidation on the P-type layer of the Si wafer, after the anodizing step is carried out. Thereby, a corner of an end portion of an inner bottom portion of the recess portion in the Si wafer caused by the anisotropic etching in the first step, can be rounded and further, the thickness of the diaphragm can be prevented from being dispersed as less as possible.

It is to be noted that, there is achieved an effect of rounding the corner produced at the end portion of the inner bottom portion of the recess portion in the Si wafer even in the case where the anodic oxidation is performed by applying voltage on the PN junction in the second step. However, in this case, only the vicinity of the PN junction of the corner can be rounded and the whole of the corner portion cannot be rounded sufficiently. By contrast, by carrying out the step of applying voltage for anodic oxidation on the P-type layer, the corner portion can be rounded sufficiently.

It is preferable that, in applying voltage on the Si wafer, a resistor is connected in series with the Si wafer and the voltage is applied via the resistor. Thereby, in applying voltage of a degree capable of carrying out the anisotropic etching on the Si wafer, the range of applied voltage is widened and the voltage control is facilitated. In this case, when resistance value of the resistor is changed in accordance with the kind of the Si wafer and the etching step, control of the voltage can be carried out further easily.

Further, the voltage applied on the Si wafer may be adjusted such that current flowing in the Si wafer becomes a predetermined value. Thereby, control of the voltage is facilitated and necessary voltage can be accurately applied onto the Si wafer.

Next, a second aspect of the present invention is described. In the second aspect of the present invention, in the case where an Si wafer having crystal orientation of substantially (110) is etched by immersing it in an alkaline etching solution, whereby an Si diaphragm in an octagonal shape is formed in the Si wafer, by applying voltage on the Si wafer during the etching operation, inclined face-portions are formed between the diaphragm face of the Si diaphragm and four (111) faces orthogonal to the diaphragm face. According to the second aspect of the present invention, the inclined face portions can be formed certainly and easily.

In the meantime, when voltage is applied on the Si wafer, micro pyramids are liable to occur on the diaphragm face. This problem can be dealt with by adjusting voltage applied on the Si wafer at least in two stages. That is, after voltage capable of forming sufficiently large inclined face portions is applied on the Si wafer, voltage for eliminating the micro pyramids may be applied on the Si wafer. Thereby, the quality of the Si wafer can be enhanced.

It is preferable that, when voltage is applied on the Si wafer, the voltage applied on the Si wafer is adjusted such that current flowing in the Si wafer becomes a predetermined value. In this case, voltage capable of forming sufficiently large inclined face portions can be certainly applied on the Si wafer. Further, when voltage applied on the Si wafer is adjusted to voltage whereby the diaphragm face is not roughened, smoothness of the diaphragm face can be promoted.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PREFERRED EMBODIMENTS (First Embodiment)

An explanation will be given of a method of forming an Si diaphragm for a semiconductor pressure sensor, a semiconductor acceleration sensor or the like according to a first embodiment of the present invention in reference to FIGS. 1 through 11.

Figure 10:
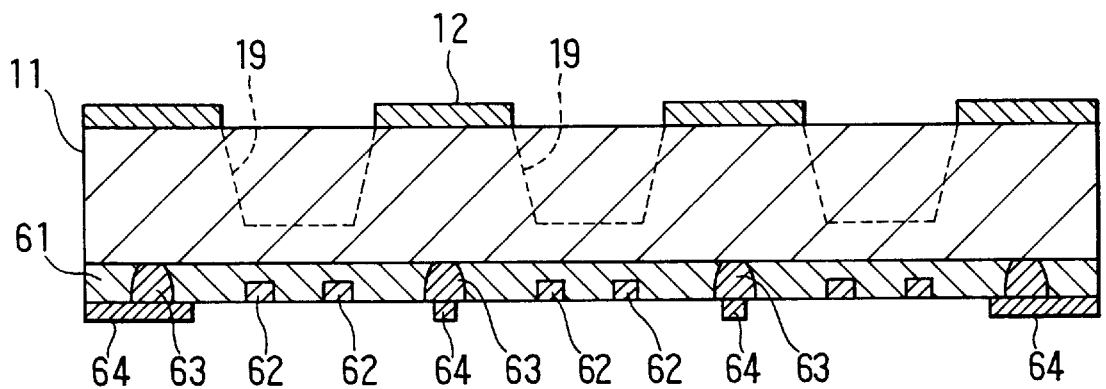
FIG. 10 is a sectional view of an Si wafer.

First, a simple explanation will be given of an Si wafer used in this embodiment in reference to FIG. 10. In FIG. 10, an Si wafer 11 is constituted by a P-type silicon wafer (for example, having resistivity of 10–20 Ωcm). An N-type Si layer (N-type epitaxial layer) 61 is formed by, for example, CVD (Chemical Vapor Deposition) on a lower face which is one face of the Si wafer 11. In the N-type Si layer 61, $P^+$-type gages 62 having predetermined shapes and $P^+$-type isolation layers 63 are formed. On the lower faces of the $P^+$-type isolation layers 63, electricity feeding electrodes 64 made of Aluminum constituting, for example, substantially a lattice shape as a whole, are formed. Voltage is applied from the electrodes 64 to the P-type Si layer which has an etching face, via the $P^+$-type isolation layers 63.

On the upper face of the Si wafer 11, an etching mask 12 composed of, for example, $SiO_2$, SiN or the like is formed. As the Si wafer 11 mentioned above, other than the P-type silicon wafer (having N-type layer), an N-type silicon wafer, a P-type silicon wafer (having no N-type layer) can be used.

Diaphragms are formed by etching the Si wafer 11 by a predetermined depth from an original thickness. Successively, the lower surface of the Si wafer 11 is pasted on, for example, a ceramic substrate via a protecting member of wax or the like. Incidentally, illustration of the protecting member and the ceramic substrate is omitted in FIG. 10. Thereby, the lower surface of the Si wafer 11 is protected.

Figure 2:
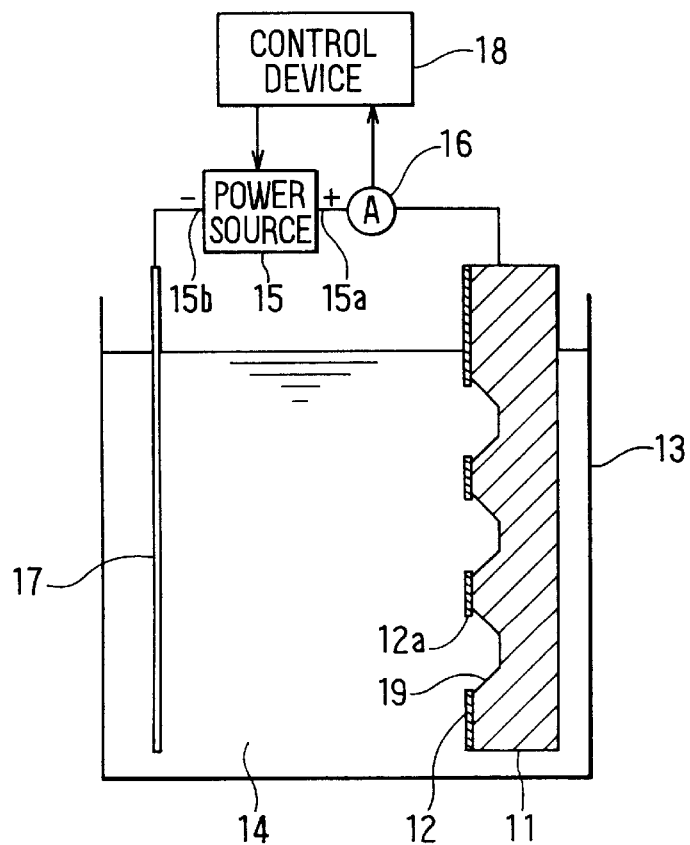
FIG. 2 is a schematic view of an etching device.

Further, as shown by FIG. 2, the Si wafer 11 (as well as the ceramic substrate) is immersed in an anisotropic etching solution 14 of, for example, KOH stored in a vessel 13 to thereby carry out anisotropic etching. In this case, the Si wafer 11 (or the electricity feeding electrodes 64) is connected to a positive side terminal 15a of a variable power source circuit 15 via a current detector 16. Further, a Pt electrode 17 connected to a negative side terminal 15b of the variable power source circuit 15 is immersed in the anisotropic etching solution 14 in the vessel 13. The variable power source circuit 15 produces a very small direct current voltage V1 of, for example, about 0–0.2 V as well as a direct current voltage V2 of, for example, 0.6 V or higher.

The current detector 16 provided between the variable power source circuit 15 and the Si wafer 11 detects the magnitude of current flowing in a circuit comprising the Si wafer 11, the anisotropic etching solution 14 and the Pt electrode 17. The detected signal is fed to a control device 18. The control device 18 is provided with a function of generally controlling etching processing, changes a value of direct current voltage produced from the variable power source circuit 15 and stops producing the direct current voltage by feeding an instruction signal to the variable power source circuit 15.

Further, the control device 18 controls temperature of the anisotropic etching solution 14 in the vessel 13. specifically, in a state where the vessel 13 is housed in an oil bath, the control device 18 controls the supply of current to a heater in the oil bath and detects temperature of silicon oil stored in the oil bath (or temperature of anisotropic etching solution 14 in the vessel 13). Thereby, the control device 18 can perform temperature control where the temperature of the anisotropic etching solution 14 in the vessel 13 is set to a desired temperature within a temperature range of about 70–120° C. by accuracy of, for example, about ±2–3° C.

Figure 1:
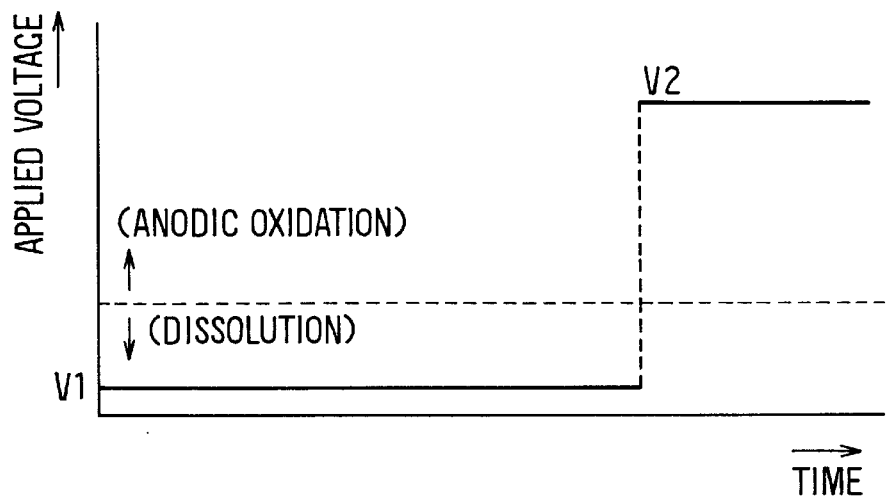
FIG. 1 is a time chart showing voltage applied on an Si wafer according to a first embodiment of the present invention.

Next, a specific explanation will be given of an etching method for etching the Si wafer 11 in reference to FIGS. 1 through 9. First, as shown in FIG. 2, the Si wafer 11 of, for example, a P-type is immersed in the anisotropic etching solution 14 of an aqueous solution of KOH at solution temperature of, for example, 110° C. and with concentration of 32 wt %. In this state, the control device 18 starts the etching control operation. First, the control device 18 feeds an instruction signal to the variable power source circuit 15 so that the variable output circuit 15 produces a very small direct current V1 as shown in FIG. 1. Thereby, the very small current voltage V1 is applied on the Si wafer 11. Under the voltage-applied state, a process of anisotropically etching the Si wafer 11 progresses. That is, etching faces in the Si wafer 11 in correspondence with opening portions 12a of the etching mask 12 are dissolved by the anisotropic etching solution 14 and recess portions 19 are thereby formed.

In this case, the very small current voltage V1 applied on the Si wafer 11 is positive voltage of a degree capable of carrying out anisotropic etching, for example, 0.1 V which will be mentioned later in details. A step of anisotropically etching the Si wafer 11 as described above (hereinafter, referred to as a first step) is carried out for a predetermined time period, for example, about 30 minutes by the control device 18. Further, the length of the time period for carrying out the first step may be pertinently set based on the depth dimension of the recess portions 19 to be formed and the etching rate of the anisotropic etching solution 14.

Figure 7:
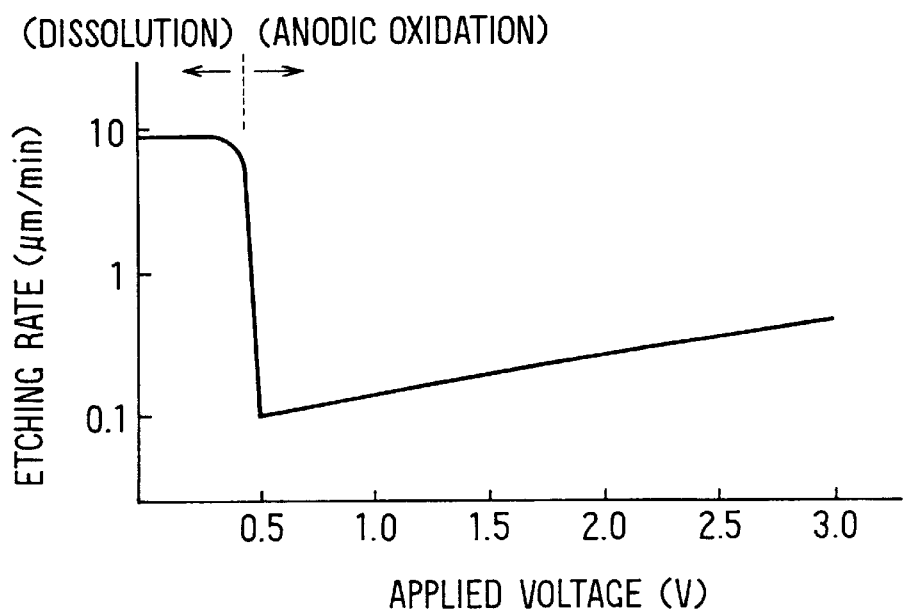
FIG. 7 is a graph showing relationship between an etching rate and an applied voltage.

The etching rate of the anisotropic etching solution 14 is varied in accordance with a kind of the solution, temperature of the solution, concentration of the solution and magnitude of positive voltage applied on the Si wafer 11. Specifically, when the anisotropic etching solution 14 is KOH, if the solution temperature is 110° C. and the concentration is 32 wt %, the etching rate of the anisotropic etching solution 14 is varied as shown in FIG. 7 in accordance with positive voltage applied on the Si wafer 11. It is known from FIG. 7 that, when the applied positive voltage is the very small direct current voltage of about 0–0.2 V, the etching rate is sufficiently large and anisotropic etching is swiftly progressed. Meanwhile, it is known from FIG. 7 that when the applied positive voltage becomes the direct current voltage of 0.6 V or higher, the etching rate becomes very small and the progress of etching becomes much retarded. The reason that the etching rate becomes very small in this way is that the etching face of the Si wafer 11 is subject to anodic oxidation by applying the direct current voltage of 0.6 V or higher.

Figure 3:
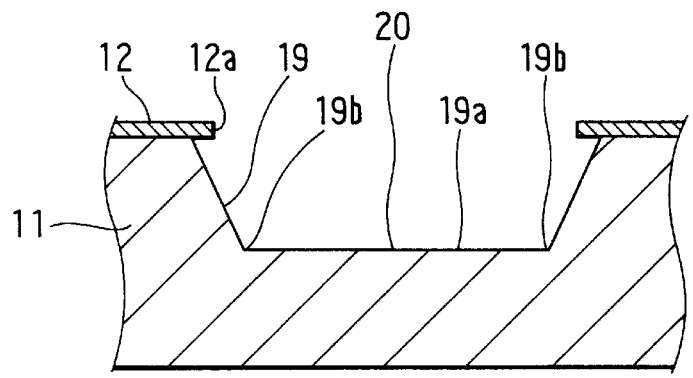
FIG. 3 is a partial cross sectional view of an Si wafer.

As shown in FIG. 3, the recess portion 19 is formed in the Si wafer 11 by the first step. In this case, because the recess portion 19 is formed by the anisotropic etching, the shape of an end portion 19b of an inner bottom portion 19a of the recess portion 19 becomes a sharp corner. The inner bottom portion 19a of the recess portion 19 constitutes a diaphragm 20.

Thereafter, the control device 18 feeds an instruction signal to the variable power source circuit 15 so that the variable power source circuit 15 produces a direct current voltage V2 of, for example, 3.0 V. Thereby, the direct current voltage V2 is applied on the Si wafer 11 as shown in FIG. 1, and the etching face of the Si wafer 11 is subject to the anodic oxidation. That is, the direct current voltage V2 is a positive voltage for anodically oxidizing the etching face of the Si wafer 11.

When the etching face of the Si wafer 11 is subject to the anodic oxidation by applying the direct current voltage V2, as shown in FIG. 7, although the etching rate becomes very small (about 1/50 of the etching rate at the first step), the etching still progresses. The reason of the etching progressing in this way is in that, as shown in FIGS. 6A, 6B and 6C, because the operation of anodically oxidizing the etching face of the Si wafer 11 and the operation of dissolving an anodized film ($SiO_2$) 11a simultaneously progress, the surface (etching face) of the Si wafer 11 is etched although the rate is retarded.

The etching becomes isotropic etching although the Si wafer 11 is immersed in the anisotropic etching solution 14. This is because the dissolution of the oxide film ($SiO_2$) 11a does not depend on the face orientation of the Si wafer 11 at all. It is to be noted that the thickness dimension of the oxide film 11a is, for example, 20–30 angstrom.

Figure 4:
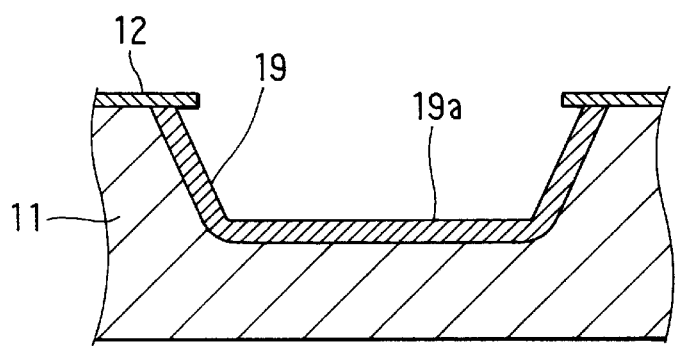
FIG. 4 is a partial cross sectional view of an Si wafer showing an isotropic etching process.
Figure 5:
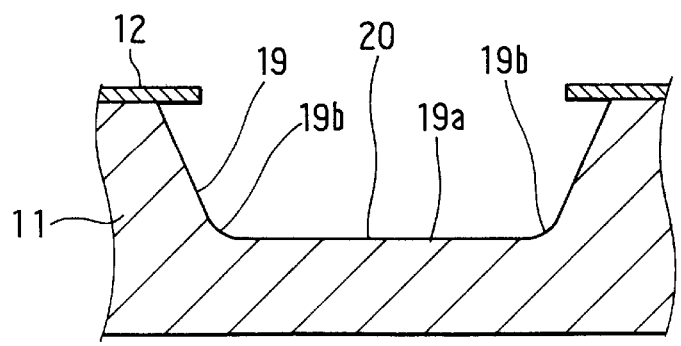
FIG. 5 is a partial cross sectional view of an Si wafer after the isotropic etching process.
Figure 6:
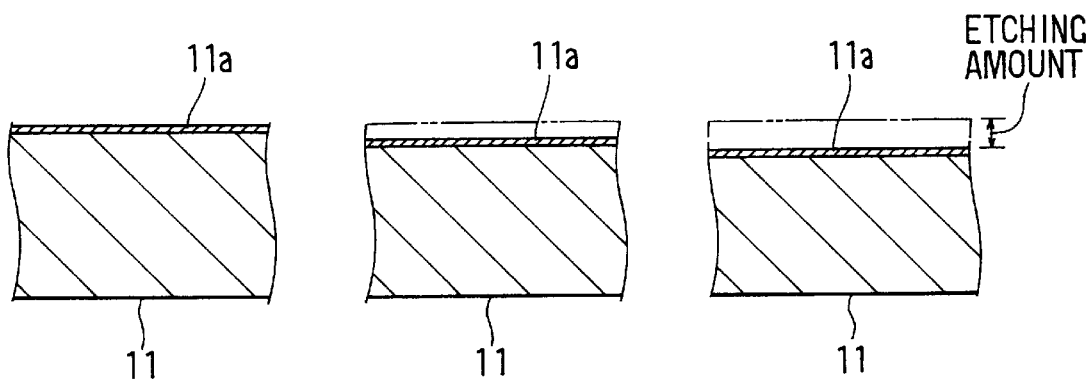
FIG 6 is a partial cross sectional views of an Si wafer explaining isotropic etching by anodic oxidation.

In this embodiment, a step of isotropically etching the etching face of the Si wafer 11 while carrying out anodic oxidation thereof as mentioned above (hereinafter, referred to as a second step), is carried out for, for example, about 10 minutes. Thereby, a process of isotropically etching the inner face of the recess portion 19 progresses so that a portion designated by a hatched region in FIG. 4 is etched away. As a result, as shown in FIG. 5, the shape of the end portion 19b of the inner bottom portion 19a of the recess portion 19 is rounded. In this case, even when the etching rate of the isotropic etching is a considerably small value, when the isotropic etching is carried out for about 10 minutes, the shape of the end portion 19b of the inner bottom portion 19a of the recess portion 19 can sufficiently be rounded.

The time period for carrying out the second step is not limited to 10 minutes as mentioned above but may pertinently be set in accordance with kind and temperature of the anisotropic etching solution 14, the value of the positive voltage V2 applied on the Si wafer 11 and so on. Specifically, it has been confirmed by experiments that, when the Si wafer 11 is of a P-type, the anisotropic etching solution 14 is an aqueous solution of KOH, the solution temperature is 110° C. and the concentration of the solution is 32 wt %, relationship among an amount of rounding the end portion 19b of the inner bottom portion 19a of the recess portion 19, a time period of applying the positive voltage V2 on the Si wafer 11 (that is, anodizing time) and a value of the positive voltage V2, is shown by FIG. 8.

Figure 8:
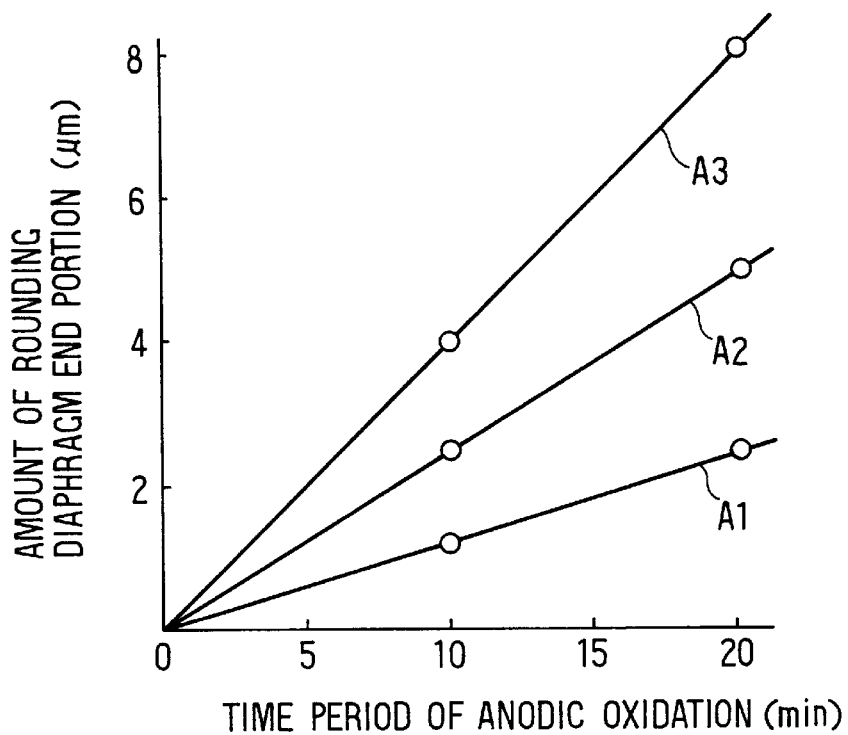
FIG. 8 is a graph showing relationship among an amount of rounding an end portion of a diaphragm, anodizing time and applied voltage.

According to FIG. 8, a straight line A1 indicates a case where the positive voltage V2 is 1.0 V, a straight line A2 indicates a case where the positive voltage V2 is 2.0 V and a straight line A3 indicates a case where the positive voltage V2 is 3.0 V. Further, in the case where the Si wafer 11 is of an N-type, almost no variation is caused by the positive voltage V2 and the relationship is substantially represented by the straight line A1.

Figure 9:
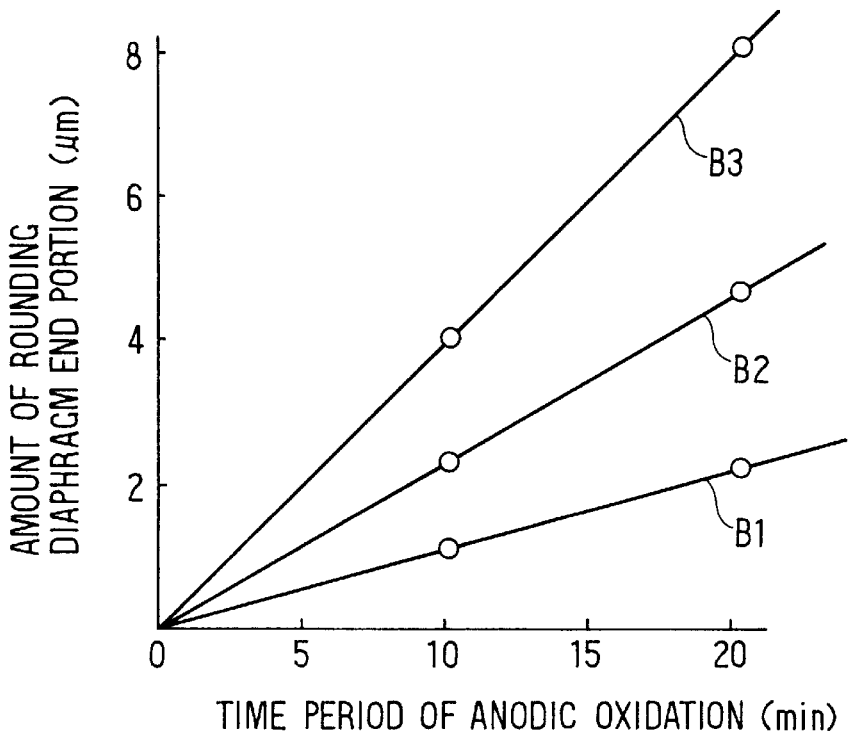
FIG. 9 is a graph showing relationship among an amount of rounding an end portion of a diaphragm, anodizing time and solution temperature.

Further, it has been confirmed by experiments that, when the positive voltage V2 applied on the Si wafer 11 is, for example, 3.0 V, the relationship among the amount of rounding the end portion 19b of the inner bottom portion 19a of the recess portion 19, the solution temperature of the anisotropic etching solution 14 and the time period of applying the positive voltage V2 (that is, anodizing time period), is shown in FIG. 9. In FIG. 9, a straight line B1 indicates a case where temperature of the solution is 80° C., a straight line B2 indicates a case where temperature of the solution is 100° C. and a straight line B3 indicates a case where temperature of the solution is 110° C.

When the second step has been finished, the Si wafer 11 is pulled up from the anisotropic etching solution 14 while applying the positive voltage V2 on the Si wafer 11 and the Si wafer 11 is rinsed by water. In this way, the process of forming the recess portion 19 in the Si wafer 11, that is, forming the diaphragm 20 is finished.

According to the present embodiment, when the recess portion 19 is formed by anisotropically etching the Si wafer 11 at the first step, a sharp corner portion is caused at the end portion 19b of the inner bottom portion 19a of the recess portion 19. However, the corner portion can be rounded by executing the isotropic etching while carrying out the anodic oxidation with respect to the recess portion 19 in the second step. By the process of rounding the corner portion, the pressure resistant strength of the diaphragm 20 of the Si wafer 11 is sufficiently increased. Further, the isotropic etching that is carried out simultaneously with the anodic oxidation at the second step progresses very slowly in comparison with the anisotropic etching at the first step. Therefore, control of an etching amount or the like is facilitated. Accordingly, the depth dimension of the recess portion 19, that is, the thickness dimension of the diaphragm 20 can be prevented from being dispersed.

Further, according to this embodiment, in the first step of anisotropically etching the Si wafer 11 by a predetermined depth, the Si wafer 11 is anisotropically etched while being applied with the positive voltage V1 which is very small to a degree capable of carrying out the anisotropic etching of the Si wafer 11. In this case, the potential at the etching face of the Si wafer 11 is shifted in the positive direction and a potential difference with respect to a metal ion nobler than Si is reduced. Therefore, impurities of metal ions (for example, Pb) or the like are difficult to be adsorbed by the etching face. Therefore, according to the present embodiment, even when the etching face of the Si wafer 11 is (110) face, the etching face is smoothed and the smoothness of the inner bottom face 19a of the recess portion 19 is further promoted. Also, a variation in dimension is reduced.

Figure 11:
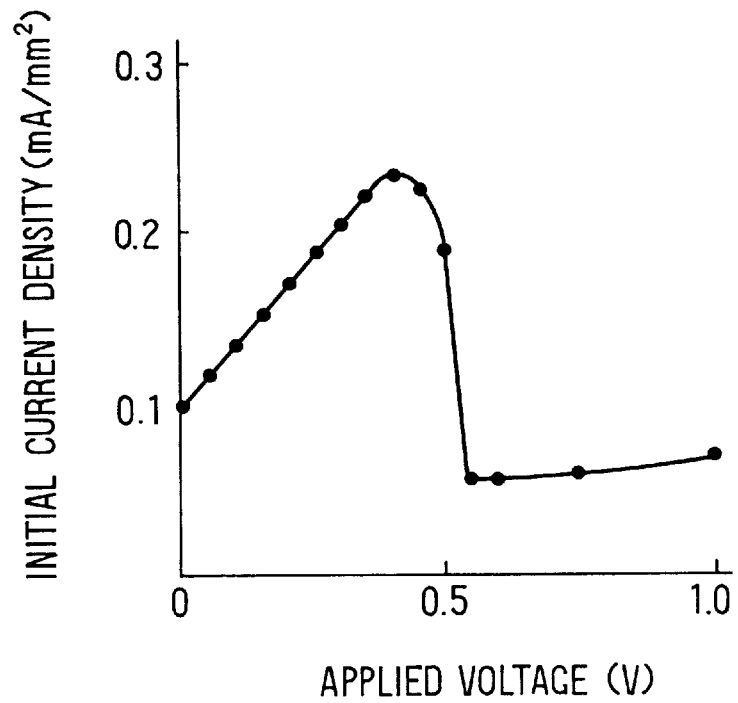
FIG. 11 is a characteristic diagram showing relationship between applied voltage and initial current density of an etching face when positive voltage is applied on a P-type Si wafer.

According to the present embodiment, current flowing in the Si wafer 11 is detected by the current detector 16 and the magnitude of the voltage V1 applied on the Si wafer 11 is adjusted by the control device 18 and the variable power source circuit 15 such that the initial current density of the etching face, that is, a value of current at an initial stage of etching divided by an etched area becomes about 0.10 through 0.15 $mA/mm^2$. Relationship between the voltage and the initial current density of the etching face when the positive voltage is applied on the Si wafer 11 of a P-type, is shown in FIG. 11. When the magnitude of the voltage V1 applied on the Si wafer 11 is adjusted as mentioned above, a value of Rz indicating the smoothness (irregularities) of the surface of the inner bottom portion 19a of the recess portion 19 becomes about 0.2 $\mu m$ or lower. To contrary, in the case where conventional anisotropic etching is carried out in which the positive voltage is not applied on the etching face, the value of Rz indicating the degree of smoothness of the etching face 19a of the recess portion 19, that is, the roughness of the etching face is about 1.0 µm. Thus, it is known that the smoothness of the etching face in the present embodiment is considerably improved.

Further, according to the present embodiment, the anisotropic etching solution 14 of KOH is used and, in the second step, the temperature of the anisotropic etching solution 14 is set to be relatively high, for example, 110° C. Therefore, the etching rate of the isotropic etching carried out simultaneously with the anodic oxidation of the Si wafer 11 by applying the positive voltage V2 for anodic oxidation to the Si wafer 11, is increased. As a result, a time period required for rounding the end portion 19b of the inner bottom portion 19a of the recess portion 19 can be shortened.

In the first step, the positive pressure V1 which is very small to a degree capable of carrying out the anisotropic etching is applied on the Si wafer 11. However, the anisotropic etching may be carried out without applying the very small positive voltage V1, that is, without applying voltage at all. In this case, although the surface smoothness of the inner bottom portion 19a of the recess portion 19 is more or less deteriorated, the rounding processing is effectively executed.

Further, in the case of the embodiment mentioned above, at an initial stage of the first step, the solution temperature of the anisotropic etching solution 14 may be unstable. In such a case, the etching may not be controlled with excellent accuracy. Therefore, it is preferable that at the initial stage of the first step, the etching face is subjected to the anodic oxidation by applying the positive voltage of, for example, 1.0 V or higher on the Si wafer 11 to suspend the etching therefor. After that, when the temperature of the anisotropic etching solution 14 is stabilized, application of the above-described positive voltage is stopped and a very small positive voltage to a degree capable of carrying out the anisotropic etching may be applied.

(Second Embodiment)

Figure 12:
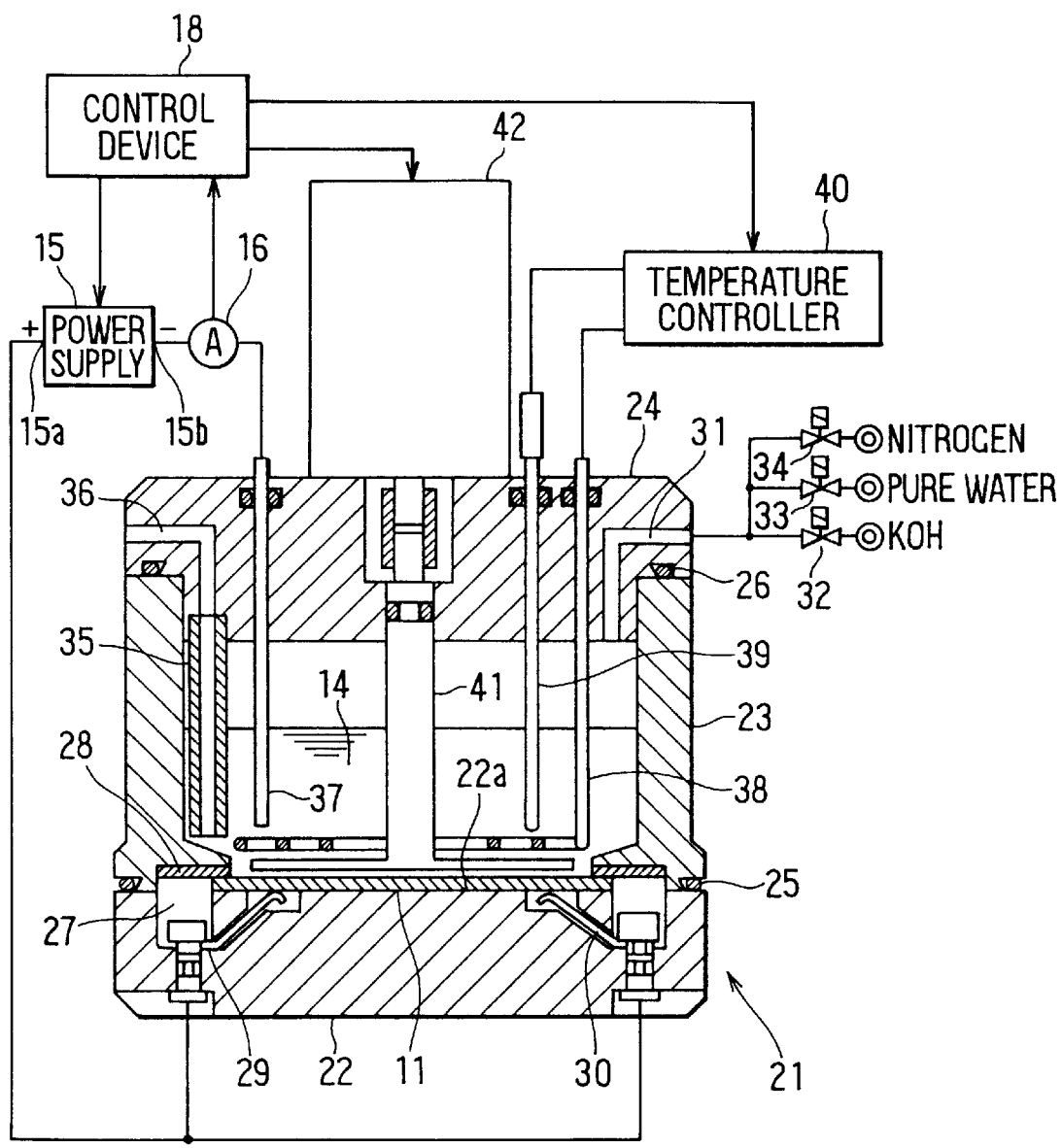
FIG. 12 is a sectional view of an etching device according to a second embodiment of the present invention.

FIG. 12 shows an etching device 21 according to a second embodiment of the present invention. Incidentally, portions the same as those in the first embodiment are attached with the same reference numbers. The etching device 21 is provided with a base 22, a cylindrical frame 23 and a lid 24 and these members are formed by a material having high insulating performance and excellent in thermally insulating performance and corrosion resistance of, for example, tetraethyl fluoride resin or the like. O-rings 25, 26 are disposed between the base 22 and the frame 23 and between the frame 23 and the lid 24, respectively. Therefore, a clearance between the base 22 and the frame 23 and a clearance between the frame 23 and the lid 24 are sealed in liquid tight by the O rings 25 and 26. As a result, a hermetically-sealed vessel is constituted by the base 22, the frame 23 and the lid 24. The anisotropic etching solution 14 is stored in the hermetically-sealed vessel.

The Si wafer 11 is arranged on an upper face 22a of the base 22. The upper face (etching face) of the Si wafer 11 is brought into contact with the anisotropic etching solution 14. An annular recess portion 27 for forming a negative pressure chamber is provided at an outer peripheral portion of the upper face 22a of the base 22. The recess portion 27 is closed by a packing member 28 in a ring-like shape. The packing member 28 fixes the Si wafer 11 by pinching the outer peripheral edge portion of the Si wafer 11 with the base 22. That is, the Si wafer 11 is fixed with the packing member 18 drawn toward the base 22 when a vacuum pump vacuums the inside of the recess portion 27.

Two anode electrodes 29 and 30 are disposed in the recess portion 27 for example. Front end portions of the anode electrodes 29 and 30 are brought into contact with the Si wafer 11. Base end portions of the anode electrodes 29 and 30 are connected to the positive side terminal 15a of the variable power source circuit 15.

A supply passage 31 is formed in the lid 24 and the anisotropic etching solution 14 is supplied in the frame 23 (hermetically-sealed vessel) via a valve 32 and the supply passage 31. Pure water is supplied into the frame 23 via a valve 33 and the supply passage 31 and nitrogen gas is supplied into the frame 23 via a valve 34 and the supply passage 31. Incidentally, the etching solution 14 or the like in the frame 23 (hermetically-sealed vessel) is exhausted to outside via a pipe 35 and an exhaust passage 36 formed in the lid 24 by a pump or the like.

A cathode electrode 37 in a rod-like shape is arranged to penetrate the lid 24 and extend to a vicinity of a bottom portion in the hermetically-sealed vessel. A base end portion of the cathode electrode 37 is connected to the negative side terminal 15b of the variable power source circuit 15 via the current detector 16.

A heater 38 for heating etching solution or the like and a temperature sensor 39 for detecting temperature of the etching solution or the like are arranged in the hermetically-sealed vessel. The supply of current to the heater 38 is controlled by a temperature controller 40. The temperature controller 40 receives temperature detecting signal outputted from the temperature sensor 39. Thereby, the temperature controller 40 can set temperature of the etching solution or the like in the hermetically-sealed vessel to a desired temperature (for example, 110° C.).

An agitating blade 41 for agitating etching solution is arranged in the hermetically-sealed vessel. The agitating blade 41 is rotated by a motor 42 arranged above the lid 24. Further, the control device 18 controls the operations of the variable power source circuit 15, the valves 32, 33 and 34, the temperature controller 40 and the motor 42.

Also when the Si wafer 11 is etched by the etching device 21 having such a constitution, the first step and the second step explained in the first embodiment are successively carried out. Accordingly, operations and effects the same as those in the first embodiment can also be achieved. Particularly, according to the second embodiment, the temperature of the etching solution can be controlled with excellent accuracy and evacuation of the etching solution or rinsing of the Si wafer 11 can swiftly be carried out. Therefore, control of the etching can be carried out further stably and with high accuracy.

Further, according to the second embodiment, the Si wafer 11 is mounted on the upper face of the base 22 of the etching device 21 and is fixed by pinching the outer peripheral edge portion of the Si wafer 11 by the ring member 28 and the base 22. Therefore, different from the first embodiment, an operation of pasting the Si wafer 11 on a ceramic substrate or the like can be dispensed with.

(Third Embodiment)

Figure 13:
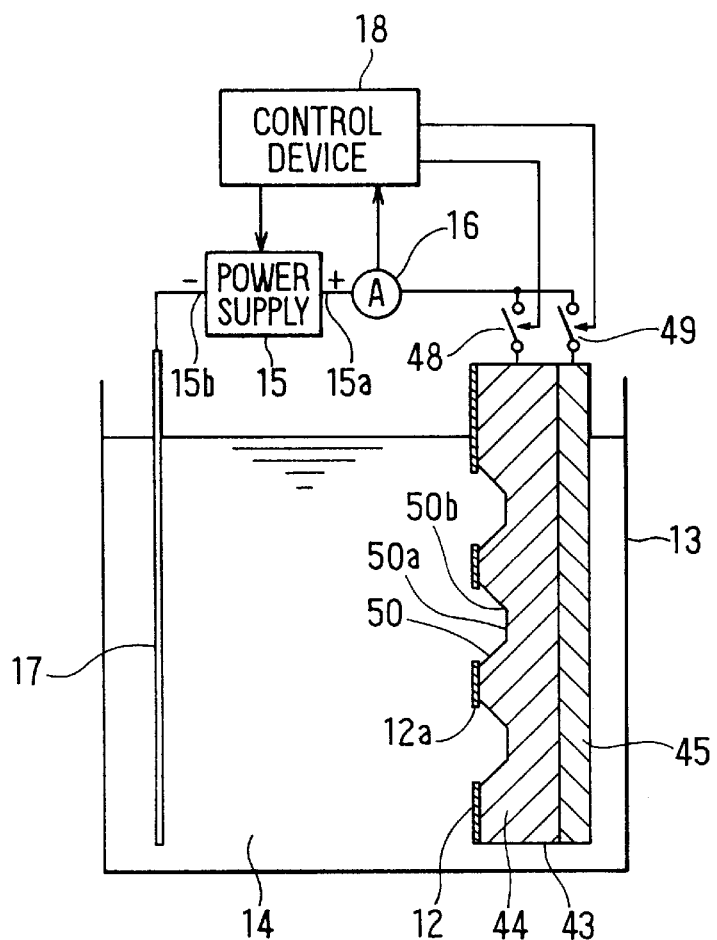
FIG. 13 is a schematic view of an etching device according to a third embodiment of the present invention.

FIG. 13 through FIG. 28 show a third embodiment of the present invention. Incidentally, portions the same as those in the first embodiment are attached with the same reference numbers. According to the third embodiment, as shown in FIG. 13, an Si wafer 43 having a PN junction is subjected to electrochemical etching. As shown in FIG. 16, the Si wafer 43 is constituted by forming an N-type Si layer (hereinafter, referred to as N layer) 45 on a lower face of a P-type silicon substrate (hereinafter, referred to as P layer) 44 by, for example, CVD. The N layer 45 is doped with P+ layers 65 by thermal diffusion and is separated into a plurality of portions of the N layer 45. At the lower face of the Si wafer 43, P layer electrodes 46 are formed on some of the P+ layers 65 electrically communicating with the P layer 44, and N layer electrodes 47 electrically communicating with the N layer 45 are formed. Further, the N layer electrodes 47 are formed on the other P+ layers 65 via an insulating layer 66 formed from an oxide film. Further, gages 62 having a predetermined shape are formed on the lower face of the Si wafer 43 (N layer 45 thereof).

An etching mask 12 composed of, for example, an SiN film or the like is formed on the upper face of the Si wafer 43 having such a constitution. The lower face of the Si wafer 43 is pasted on, for example, a ceramic substrate via a protecting member of wax or the like to protect the lower face of the Si wafer 43.

The Si wafer 43 (as well as the ceramic substrate) is immersed in the anisotropic etching solution 14 composed of, for example, KOH stored in the vessel 13, whereby etching is carried out. In this case, the P layer 44 (P layer electrodes 46 thereof) of the Si wafer 43 is connected to the positive side terminal 15a of the variable power source circuit 15 via a relay 48 and the N layer 45 (N layer electrode 47 thereof) of the Si wafer 43 is connected to the positive side terminal 15a of the variable power source circuit 15 via a relay 49. The Pt electrode 17 connected to the negative side terminal 15b of the variable power source circuit 15 is immersed into the anisotropic etching solution 14 in the vessel 13. The two relays 48 and 49 are controlled by the control device 18 on an ON/OFF control basis.

The control device 18 can control temperature of the anisotropic etching solution 14 in the vessel 13 similar to the first embodiment. That is, the vessel 13 is housed in an oil bath, the control device 18 controls the supply of current to a heater in the oil bath and detects temperature of silicone oil in the oil bath (accordingly, temperature of anisotropic etching solution 14 in the vessel 13).

Next, a specific explanation will be given of an etching method for etching the Si wafer 43 having a PN junction in reference to FIG. 14, FIG. 15 and FIG. 17 through FIG. 28. First, as shown in FIG. 13, the Si wafer 43 is immersed into the anisotropic etching solution 14 composed of an aqueous solution of 32 wt % KOH with a temperature of, for example, 110° C., whereby the control device 18 starts the operation of etching control. Then, the control device 183 turns on the relay 48 on the side of the P layer electrode 46 and turns off the relay 49 on the side of the N layer electrode 47, and feeds an instruction signal to the variable power source circuit 15 so that the variable power source circuit 15 produces a very small direct current voltage V1 (for example, 0.15 V).

Thereby, the very small direct current voltage V1 is applied to the P layer 44 of the Si wafer 43. Under the voltage-applied state, a process of anisotropically etching a left face in FIG. 13 (etching face) of the P layer 44 of the Si wafer 43 progresses. In this case, the etching face in correspondence with the opening portions 12a of the etching mask 12 in the P layer 44 of the Si wafer 43 is dissolved by the anisotropic etching solution 14. As a result, recess portions 50 are formed in the P layer 44.

The very small direct current voltage V1 applied to the P layer 44 of the Si wafer 43 is the positive voltage to a degree which does not hamper the anisotropic etching. A step of anisotropically etching the Si wafer 43 (hereinafter, referred to as a first step) is carried out for a predetermined time period, for example, about 30 minutes by the control device 18. Incidentally, the length of time period for carrying out the first step may pertinently be set based on the depth dimension of the recess portion 50 to be formed and the etching rate of the anisotropic etching solution 14.

Figure 18:
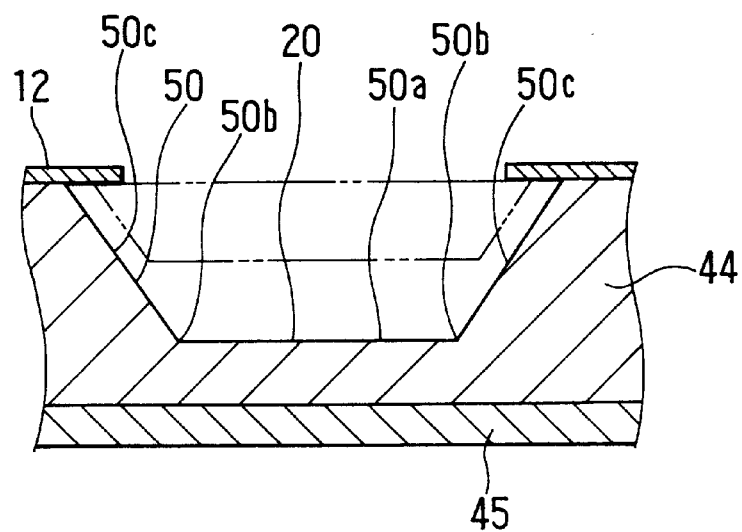
FIG. 18 is a sectional view of the recess portion (diaphragm)

By executing the first step, as shown in FIG. 13 and FIG. 18, the recess portion 50 is formed in the P layer 44 of the Si wafer 43. In this case, because the recess portion 50 is formed by the anisotropic etching, the shape of an end portion 50b of the inner bottom portion 50a of the recess portion 50 becomes a sharp corner. The inner bottom portion 50a of the recess portion 50 functions as a diaphragm 20.

Figure 14:
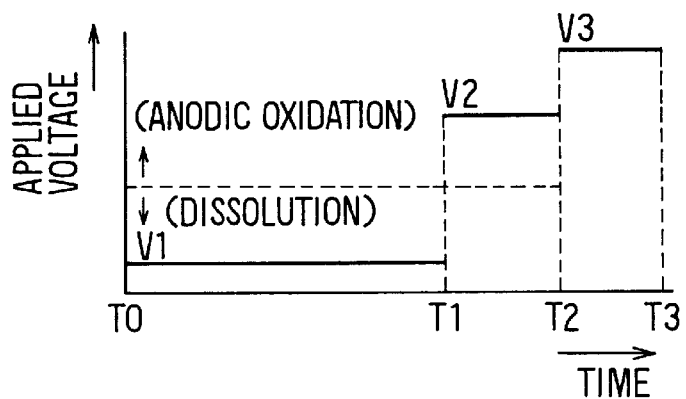
FIG. 14 is a time chart showing voltage applied on an Si wafer according to the third embodiment of the present invention.
Figure 15:
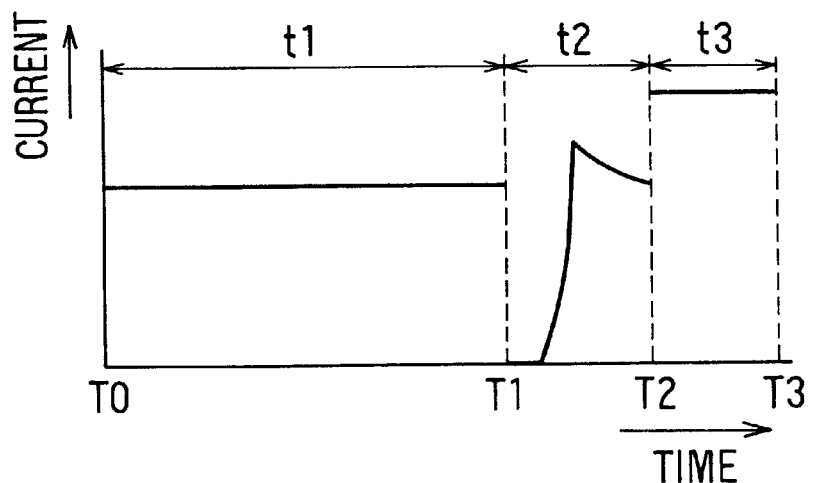
FIG. 15 is a time chart indicating a change in detected current.
Figure 16:
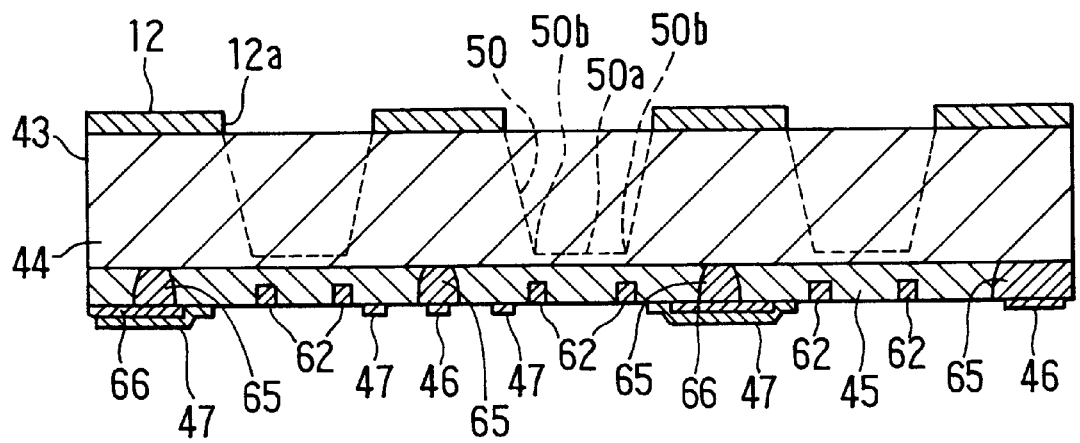
FIG. 16 is a sectional view of an Si wafer.

The very small positive voltage V1 is applied to the P layer 44 in the first step from a time point T0 to a time point T1 as shown in FIG. 14, and current flowing in the P layer 44 of the Si wafer 43 (value of current detected by the current detector 16) is shown in a range from the time point T0 to the time point T1 of FIG. 15.

At the time point T1 where the first step has been finished, that is, at the time point where the etching has progressed to a vicinity of the PN junction of the Si wafer 43, the control device 18 turns off the relay 48 on the side of the P layer electrode 46 and turns on the relay 49 on the side of the N layer electrode 47. Further, the control device 18 feeds an instruction signal so that the variable power source circuit 15 produces a direct current voltage V2 (for example, 3.0 V) as positive voltage for anodic oxidation. Thereby, the direct current voltage V2 is applied to the N layer 45 of the Si wafer 43. By applying the voltage to the N layer 45, similar to normal (conventionally well-known) electrochemical stop etching, when the etching progresses to a vicinity of the PN junction of the Si wafer 43, the etching face is anodically oxidized and the etching is stopped there. That is, by applying the direct current voltage V2 to the N layer 45, a depletion layer extends from the PN junction between the N layer 45 and the P layer 44. The etching progresses up to the surface of the depletion layer. Thereafter, since current flows through the depletion layer, an anodized film is formed on the etching face of the P layer 44. In this state, the anodized film is etched with a very small etching rate.

Particularly, in the present embodiment, a time period of the step of applying the direct current voltage V2 is about 5 minutes (time t2 from the time point T1 to the time point T2 of FIG. 14 and FIG. 15). Accordingly, the etching is almost stopped.

However, in this case, although the etching face (diaphragm face) in a vicinity of the PN junction between the N layer 45 and the P layer 44 is anodically oxidized, the side face of the recess portion 50 is not anodically oxidized. Therefore, a corner of the recess portion 50 formed by the anisotropic etching is not sufficiently subjected to anodic oxidation. As a result, the whole of the end portion of the recess portion (end portion of diaphragm) cannot sufficiently be rounded only by the above-described process. Incidentally, the step of anodically oxidizing the etching face of the wafer 43 is hereinafter referred to as an anodizing step.

At the time point T2 where the anodizing step has been finished, the control device 18 turns on the relay 48 on the side of the P layer electrode 46 and turns off the relay 49 on the side of the N layer electrode 47, and further feeds an instruction signal to the variable power source circuit 15 so that the variable power source circuit 15 produces a direct current voltage V3 (for example, 3.5 V) as a positive voltage for anodic oxidation. Thereby, the direct current voltage V3 is applied to the P layer 44 of the Si wafer 43. By applying the direct current voltage V3, similar to the second step of the first embodiment, the etching face (diaphragm face and side wall portion of the recess portion) of the Si wafer 43 is anodically oxidized, whereby isotropic etching progresses although the etching rate is very small (about 1/50 of etching rate in the first step).

According to the third embodiment, the step of isotropically etching the etching face of the Si wafer 43 while carrying out the anodic oxidation as mentioned above (hereinafter, referred to as a second step) is carried out for, for example, about 5 minutes. Thereby, the process of isotropically etching the inner face portion of the recess portion 50 of the Si wafer 43 progresses, whereby the shape of the end portion 50b of the inner bottom portion 50a of the recess portion 50 is rounded. In this case, even when the etching rate of the isotropic etching is a considerably small value, when the isotropic etching is carried out for about 5 minutes, it is sufficient to round the shape of the end portion 50b of the inner bottom portion 50a of the recess portion 50. The time period of carrying out the second step is not limited to 5 minutes as mentioned above but may pertinently be set in accordance with kind or temperature of the anisotropic etching solution 14, a value of the positive voltage V3 applied to the Si wafer 43 and so on.

When the execution of the second step has been finished (at a time point T3), the Si wafer 43 is pulled up from the anisotropic etching solution 14 while applying the positive voltage V3 to the Si wafer 43 and the Si wafer 43 is rinsed by water. Thereby, the process of forming the recess portion 50 in the Si wafer 43, that is, forming the diaphragm 20 is finished.

According to the third embodiment, in the first step of anisotropically etching the Si wafer 43 having the PN junction by a predetermined depth, the Si wafer 43 is applied with the very small positive voltage V1 to a degree capable of anisotropically etching the Si wafer 43. Accordingly, the potential of the etching face of the Si wafer 43 is shifted in the positive direction and a potential difference with respect to a metal ion nobler than Si is reduced. Therefore, impurities such as metal ions (for example, Pb) or the like is difficult to be adsorbed onto the etching face. Accordingly, even when the etching face of the Si wafer 43 is (110) face, the etching face is smoothed, and smoothness of the inner bottom face 19a of the recess portion 19 can further be enhanced.

Figure 24:
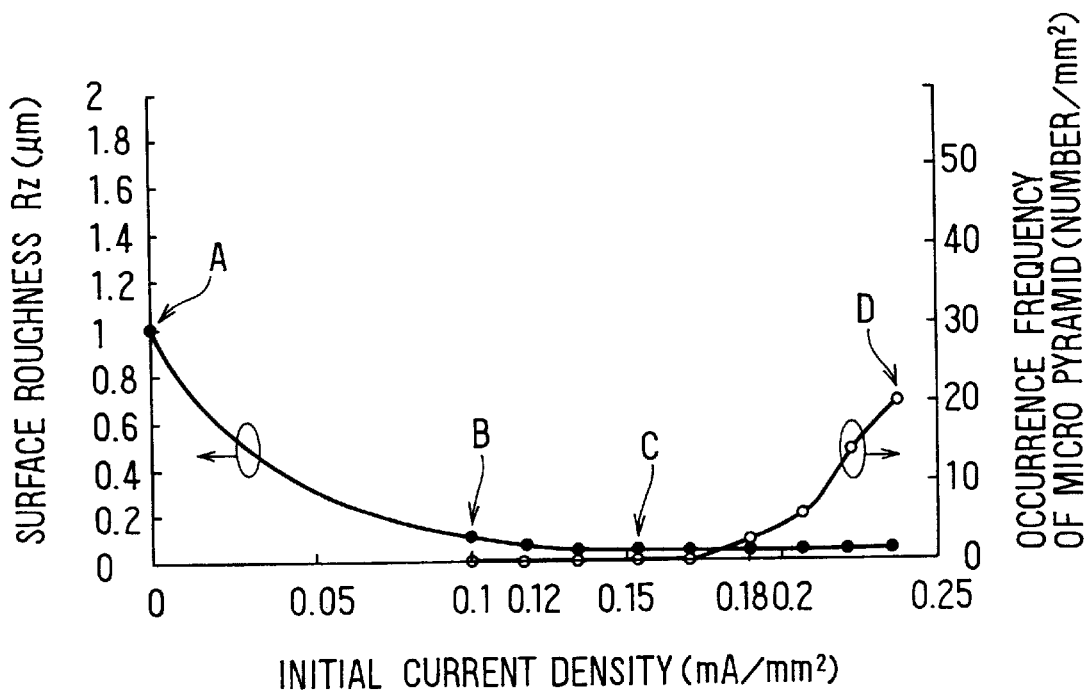
FIG. 24 is a graph showing relationship between roughness of an etching face and initial current density as well as relationship between frequency of micro pyramids and initial current density.

A graph of measuring relationship between initial current density flowing in the Si wafer 43 and a value Rz representing the smoothness of the etching face (roughness of face) is shown in FIG. 24. According to FIG. 24, black round points indicate actually measured points of face roughness Rz and a curve connecting the black round points. shows relationship between the initial current density and the face roughness Rz. Incidentally, in FIG. 24, while round points indicate actually measured points of occurrence frequency of micro pyramids and a curve connecting the while round points shows relationship between the initial current density and the occurrence frequency of micro pyramids.

According to the third embodiment, as a result of setting initial current density to 0.13 mA/mm$^2$, the face roughness Rz of the etching face becomes about 0.1 μm. To contrary, when conventional electrochemical etching is carried out in which voltage is not applied on the etching face (P layer 44), the face roughness Rz of the etching face is about 1.0 μm. Accordingly, the smoothness of the etching face is considerably improved in the third embodiment. Incidentally, the graph of FIG. 24 shows an example of an experiment when an aqueous solution of 32 wt % KOH at, for example, 110° C. is used as the anisotropic etching solution 14.

Figure 25:
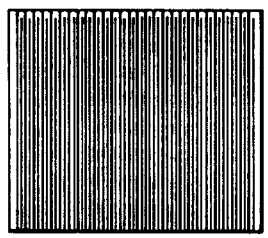
FIGS. 25 through 28 are views showing a condition of an etching face.
Figure 26:
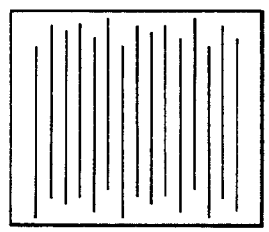
Figure 27:
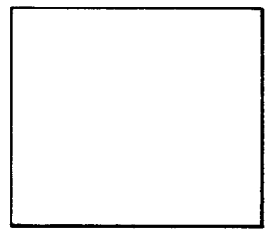
Figure 28:
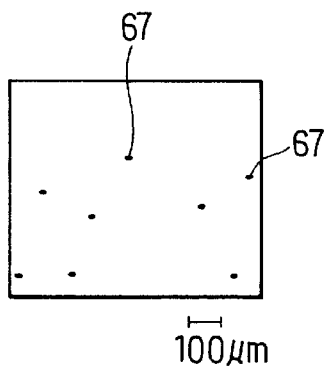

The condition of the etching face at point A in FIG. 24, that is, in the case where the initial current density is 0 (case where voltage is not applied) is shown in FIG. 25. Further, the condition of the etching face at point B in FIG. 24, that is, in the case where the initial current density is 0.10 mA/mm$^2$ is shown in FIG. 26. Furthermore, the condition of the etching face at point C in FIG. 24, that is, in the case where the initial current density is about 0.15 mA/mm$^2$ is shown in FIG. 27. Also, the condition of the etching face at point D in FIG. 24, that is, in the case where the initial current density is about 0.24 mA/mm$^2$ is shown in FIG. 28. Incidentally, FIG. 25, FIG. 26 FIG. 27 and FIG. 28 are drawings which schematically draw photographs taking pictures of the etching faces.

From the graph of FIG. 24 and drawings of FIGS. 25 through 27, when the initial current density is made larger than 0.10 mA/mm$^2$, it is clearly known that the smoothness of etching face is improved. Meanwhile, when the initial current density is made larger than about 0.18 mA/mm$^2$, as shown in FIG. 28, micro pyramids 67 having the cross-sectional face in a rhombic shape start to occur on the etching face. Further, the micro pyramids 67 frequently occur at the initial current density of 0.20 mA/mm$^2$ or higher. A number of the micro pyramids 67 having a size (for example, the length of a longer diagonal line of a rhombic shape) of 20 μm or larger per 1 mm$^2$ is defined as an occurrence frequency of the micro pyramids 67 and the graph of FIG. 24 is obtained by measuring the occurrence frequency. It is clearly known from the graph of FIG. 24 that, as the initial current density is made larger, the occurrence frequency of the micro pyramids 67 is increased and the quality of the diaphragm 20 is deteriorated. Accordingly, it is known that the quality the diaphragm 20 is mostly improved when the initial current density is set to about 0.10 mA/mm$^2$ through 0.20 mA/mm$^2$, preferably, 0.12 mA/mm$^2$ through 0.18 mA/mm$^2$. Incidentally, the face roughness Rz of the etching face in the case where the micro pyramids 67 occur, is indicated by a face roughness at portions having none of the micro pyramids 67 in the etching face. Further, in the case where the etching is carried out in such a manner that the micro pyramids occur, the micro pyramids can be eliminated by etching under conditions where the micro pyramids do no occur thereafter.

According to the third embodiment, the very small positive voltage V1 to the degree capable of anisotropically etching the Si wafer 43 is applied to the Si wafer 43. Therefore, the dispersion in dimension of the diaphragm 20 (dimension indicated by D1 in FIG. 17) can considerably be reduced. Specifically, the dispersion in dimension of the diaphragm fabricated by conventional electrochemical etching is about ±30 μm whereas the dispersion in dimension of the diaphragm 20 fabricated by the third embodiment is about ±10 μm. A simple explanation will be given of a reason that the dispersion in the dimension D1 of the diaphragm is reduced.

Figure 17:
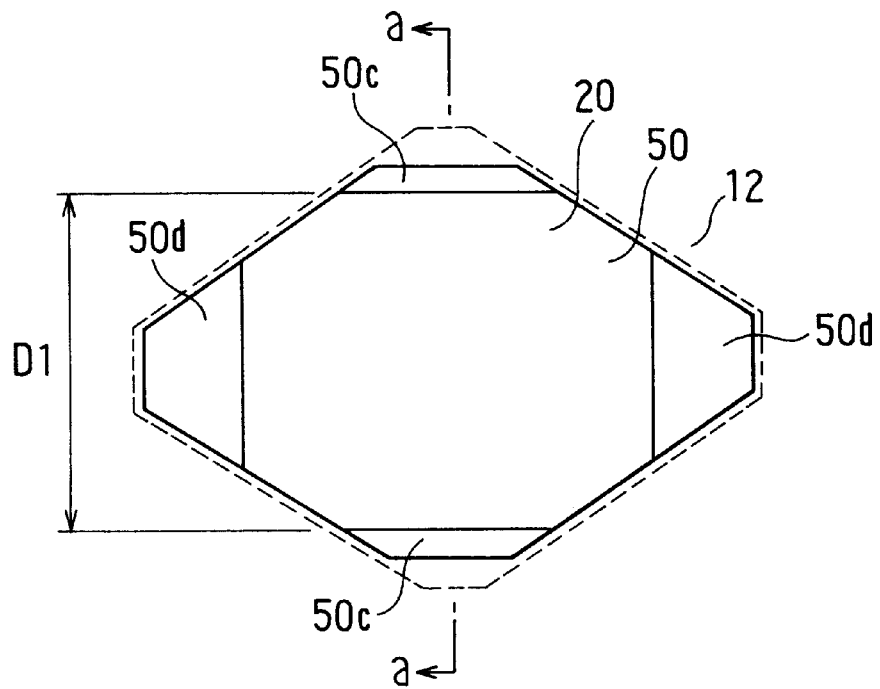
FIG. 17 is a front view of a recess portion (diaphragm)

A front view of the recess portion 50 formed in the Si wafer 43 is shown in FIG. 17 and a sectional view taken along a line a—a in FIG. 17 of the recess portion 50 is shown in FIG. 18. In FIGS. 17 and 18, the bottom face portion 50a of the recess portion 50 is (110) face. Further, in FIG. 17, inclined faces 50c on the upper and lower end portion sides are (100) face and the inclined faces 50d on the left and right end portion sides are (111) faces.

When the conventional electrochemical etching is carried out, only a positive voltage of, for example, 1.0 V or higher is applied on the N layer 45 of the Si wafer 43. Accordingly, a state where a PN junction is inversely biased is brought about and the anisotropic etching is progressed under a state where the voltage is not applied substantially on the P layer 44. In this case, the potential of the etching face of the Si wafer 43 is not shifted. Therefore, impurities of metal ions (for example, Pb) or the like are liable to be adsorbed on the etching face, whereby the etching rate thereof may be varied. The variation in the etching rate is changed in accordance with the concentration of the impurity (Pb) in the anisotropic etching solution 14, face orientation of the etching face, the temperature of the anisotropic etching solution 14 and so on.

Figure 19:
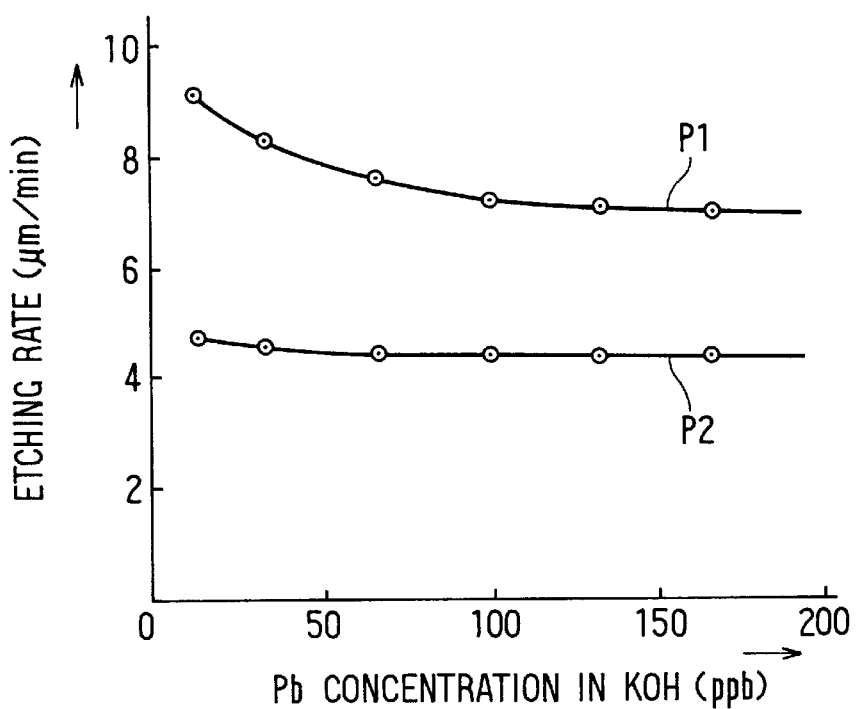
FIG. 19 is a graph showing relationship among etching rate, concentration of Pb and face orientation of an Si wafer.

Specifically, the etching rate is varied as shown in FIG. 19 in accordance with the concentration of Pb in the anisotropic etching solution 14. In FIG. 19, a curve P1 indicates a case where the face orientation of the etching face is (110) face and a curve P2 indicates a case where the face orientation thereof is (100) face. In these cases, the anisotropic etching solution 14 is, for example, an aqueous solution of 32 wt % KOH at 110° C.

Figure 20:
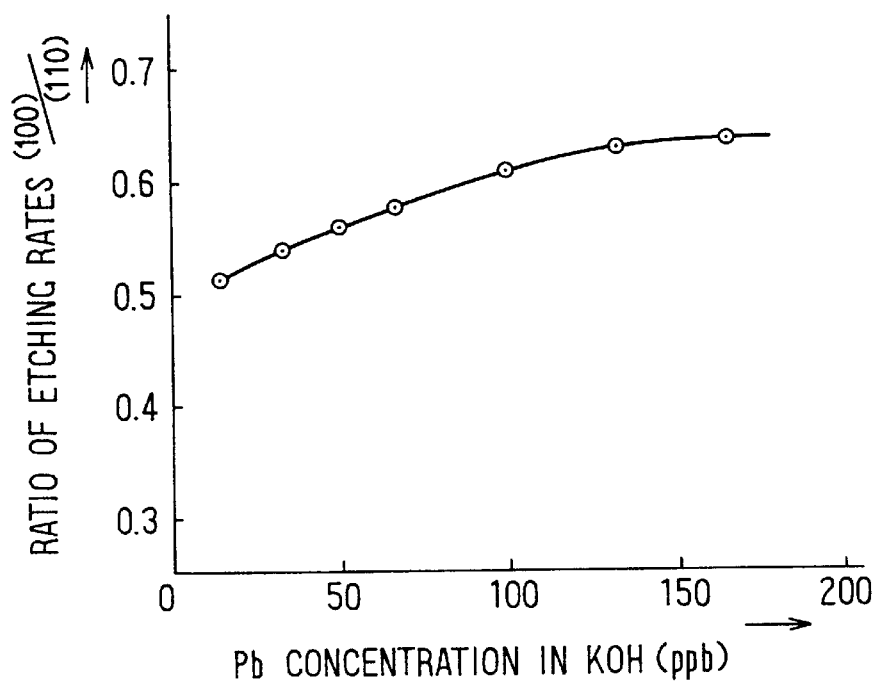
FIG. 20 is a graph showing relationship between a ratio of etching rates and concentration of Pb.

Further, when a ratio of the etching rate of (100) face and the etching rate of (110) face is calculated, a graph of FIG. 20 is obtained. That is, it is known that the ratio of the etching rates of the two faces is varied considerably in accordance with the concentration of Pb in the anisotropic etching solution 14. Further, when the ratio of etching rates of the two faces is varied, as shown by FIG. 18, etched amounts of (100) face and (110) face are considerably varied. The etching of (110) face is stopped at a vicinity of an interface of PN junction (actually, a position in front of the interface of the PN junction by about 2 through 5 μm) and the etching depth is substantially constant. Therefore, there is caused a drawback where the dimension D1 of the formed diaphragm 20 is varied by about ±30 μm.

Figure 21:
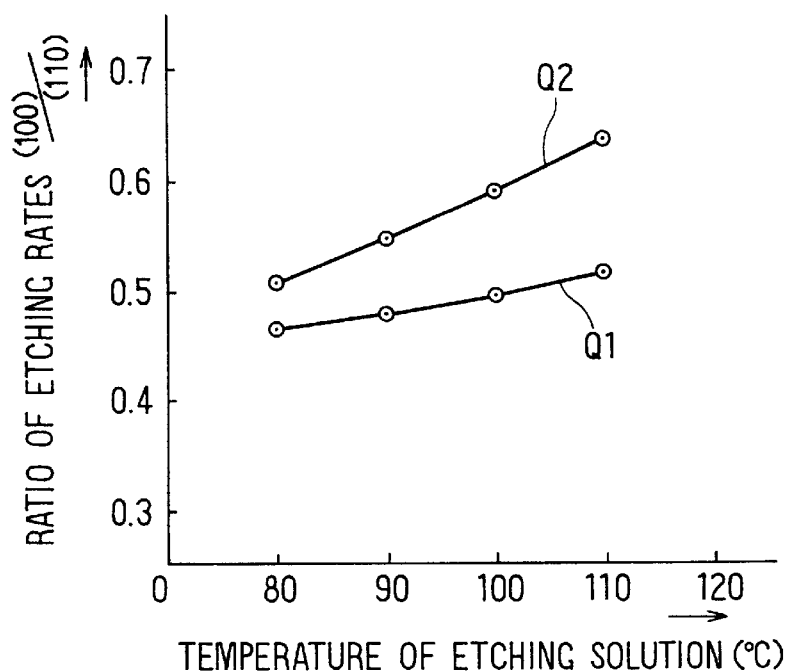
FIG. 21 is a graph showing relationship among a ratio of etching rates, solution temperature and concentration of Pb.

Particularly, it is known that the ratio of the etching rates of the two faces which is varied in accordance with the concentration of Pb in the anisotropic etching solution 14, undergoes strongly influence of temperature of the anisotropic etching solution 14. An example of variation caused by the solution temperature is shown by FIG. 21. In FIG. 21, a curve Q1 indicates a case where the concentration of Pb is 15 ppb and a curve Q2 indicates a case where the concentration of Pb is 30 ppb. It is known from FIG. 21 that the higher the temperature of the anisotropic etching solution 14, the larger variation is resulted in the ratio of the etching rates of the two faces caused by the concentration of Pb in the anisotropic etching solution 14. Accordingly, in the case of carrying out the conventional electrochemical etching, if the temperature of the anisotropic etching solution 14 is made high, the variation in the dimension D1 of the diaphragm is further increased.

It is to be noted that, according to the conventional electrochemical etching, when the etching face reaches a vicinity of the PN junction (front end of the depletion layer extending from the PN junction), the etching face is anodically oxidized and the etching is automatically stopped. Accordingly, the depth dimension of the recess portion, that is, the thickness dimension of the diaphragm can be controlled with high accuracy.

Figure 22:
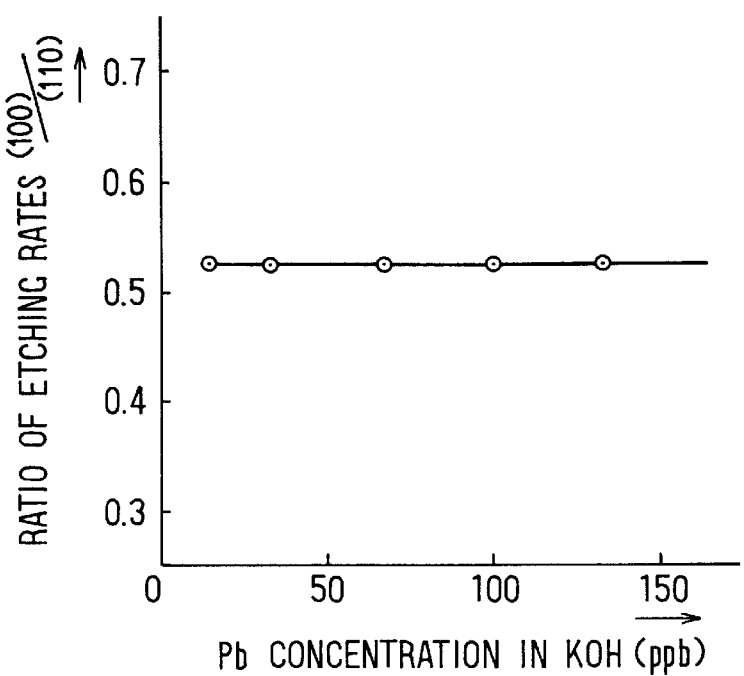
FIG. 22 is a graph showing relationship between a ratio of etching rates and concentration of Pb.

In contrast to the conventional electrochemical etching mentioned above, according to the third embodiment, in the first step of anisotropically etching the Si wafer 43 up to a predetermined depth (so that the P layer of about 10 through 20 μm remains from the interface of the PN junction), the Si wafer 43 is anisotropically etched while applying the very small positive voltage V1 to a degree which does not hamper the anisotropic etching of the Si wafer 43 to the P layer 44. In this case, the potential of the etching face of the Si wafer 43 is shifted in the positive direction. Therefore, an impurities of metal ions (for example, Pb) or the like are difficult to be adsorbed onto the etching face. Accordingly, the ratio of the etching rate of (100) face to the etching rate of (110) face of the Si wafer 43 becomes almost constant regardless of the concentration of the impurity (Pb) in the anisotropic etching solution 14 as shown in a graph of FIG. 22. As a result, the dispersion in the dimension D1 of the diaphragm 20 manufactured by the third embodiment is reduced to about ±10 μm. Further, the accuracy of the etched face is also promoted. Incidentally, the graph of FIG. 22 shows a result in the case where, for example, an aqueous solution of 32 wt % KOH at 110° C. is used as the anisotropic etching solution 14, the voltage applied on the P layer 44 is, for example, 0.1 V and the current density of current flowing in the Si wafer 43 is set to 0.13 mA/mm$^2$.

Figure 23:
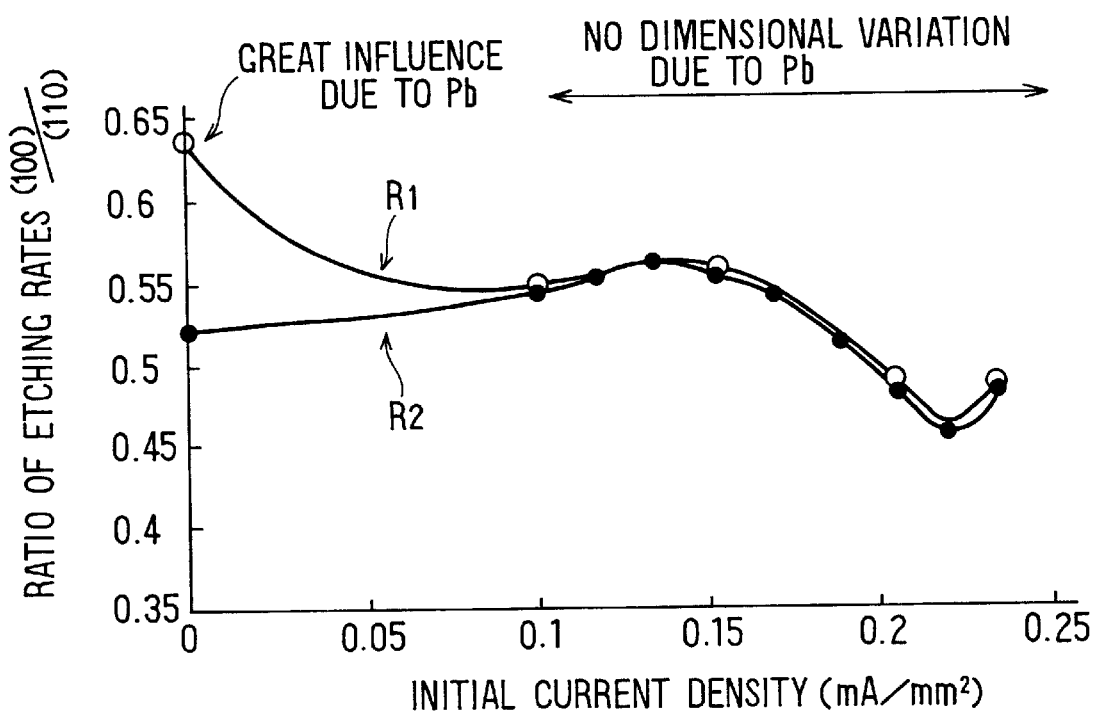
FIG. 23 is a graph showing relationship between a ratio of etching rates and initial current density.

When the anisotropic etching solution 14 composed of an aqueous solution of 32 wt % KOH at 110° C. is used, a graph of measuring relationship between a ratio of the etching rate of (100) face to the etching rate of (110) face and the current density of current flowing in the Si wafer 43 is shown by FIG. 23. In FIG. 23, a curve R1 indicates a case where the concentration of Pb is 130 ppb and a curve R2 indicates a case where the concentration of Pb is 15 ppb. It is known from FIG. 23 that in the case where initial current density is 0 mA/mm$^2$ (case where voltage is not applied), the ratio of the etching rates is increased. Further, in the case where the initial current density is larger than 0.18 mA/mm$^2$, the micro pyramids occur on the etching face. Therefore, according to the third embodiment, the magnitude of the voltage V1 applied on the P layer 44 of the Si wafer 43 is adjusted by the control device 18 and the variable power source circuit 15 such that the initial current density falls in a range of 0.10 mA/mm$^2$ or higher and 0.18 mA/mm$^2$ or lower.

Further, according to the third embodiment, at the time point T1 where the first step has been finished, that is, the time point where the etching has progressed up to a vicinity of the PN junction of the Si wafer 43 (region on the side of P layer of interface of PN junction by about 10 through 20 μm), application of voltage on the P layer 44 is stopped and the direct current voltage V2 is applied on the N layer 45 as a positive voltage for anodic oxidation. By applying the voltage V2, similar to normal electrochemical etching, the etching progresses to a vicinity of the PN junction of the Si wafer 43. When the etching face reaches a front end of a depletion layer extending from the PN junction, the etching face (diaphragm face) is anodically oxidized and the etching is automatically and substantially stopped. Therefore, the depth dimension of the recess portion 50, that is, the thickness dimension of the diaphragm 20 can be formed with high accuracy.

Further, according to the third embodiment, at the time point T2 where the anodizing step has been finished, application of voltage on the N layer 45 is stopped and the direct current voltage V3 (for example, 3.5 V) is applied on the P layer 44 as a positive voltage for anodic oxidation. By applying the voltage V3, similar to the second step of the first embodiment, the etching face (diaphragm face and side wall portion) of the Si wafer 43 is anodically oxidized and the isotropic etching progresses although the etching rate thereof is slow. Thereby, the process of isotropically etching the inner bottom portion 50*a* of the recess portion 50 of the Si wafer 43 progresses and the shape of the end portion 50*b* of the inner bottom portion 50*a* of the recess portion 50 is rounded. As a result, the pressure resistant strength of the diaphragm 20 is increased.

(Fourth Embodiment)

Figure 29:
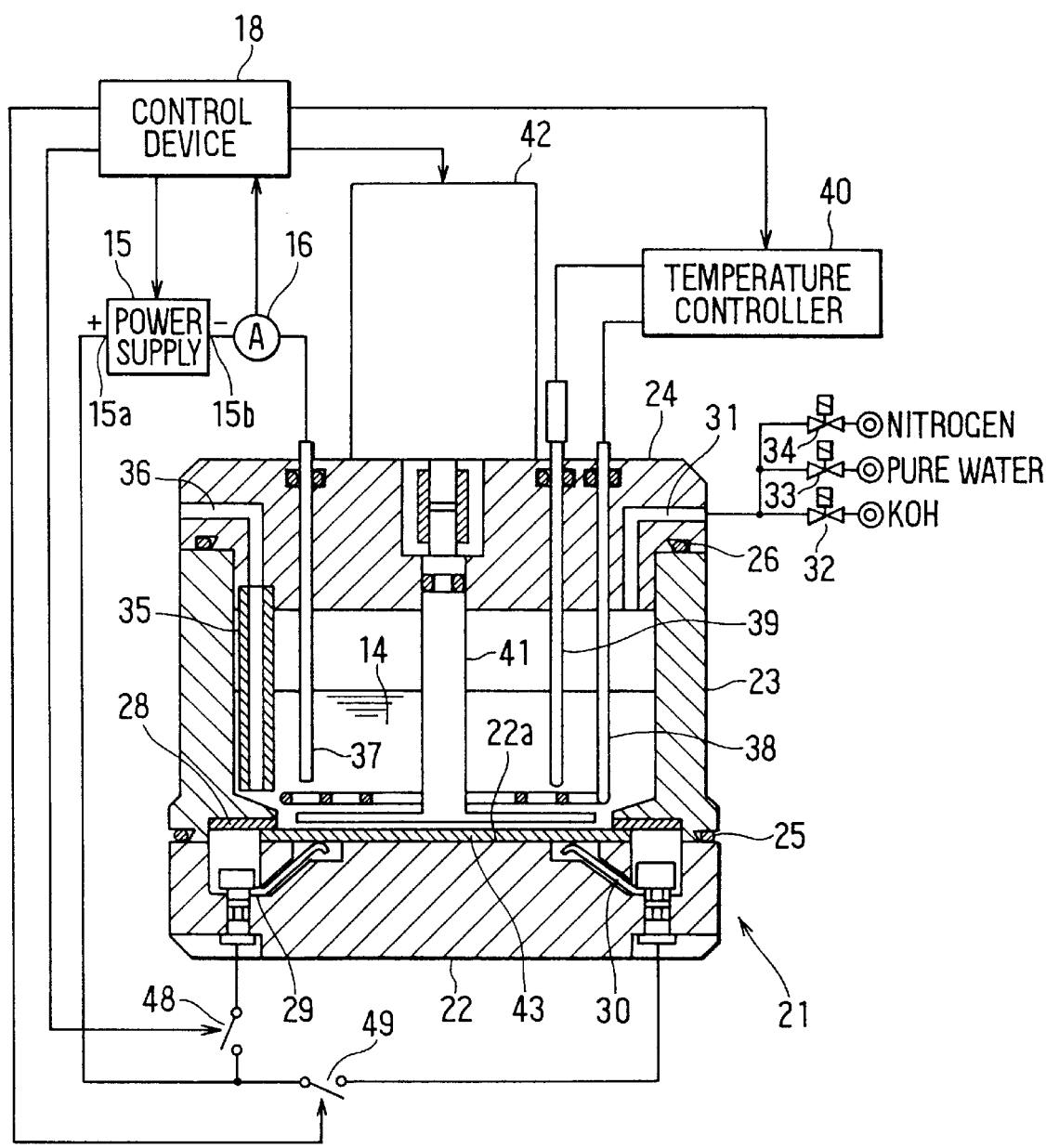
FIG. 29 is a sectional view of an etching device according to a fourth embodiment of the present invention.

FIG. 29 shows a fourth embodiment of the present invention. Incidentally, portions the same as those in the second and the third embodiments are attached with the same reference numbers. According to the fourth embodiment, in etching the Si wafer 43 having a PN junction, the etching device 21 shown in FIG. 29 is used. The etching device 21 is substantially the same as the etching device shown in FIG. 12 and is different therefrom in the following points.

That is, the front end portion of the anode electrode 29 that is one of the two anode electrodes 29 and 30, is connected to the P layer 44 of the Si wafer 43 and the front end portion of the other anode electrode 30 is connected to the N layer 45 of the Si wafer 43. Further, the base end portion of the anode electrode 29 is connected to the positive side terminal 15a of the variable power source circuit 15 via the relay 48 and the base end portion of the other anode electrode 30 is connected to the positive side terminal 15a of the variable power source circuit 15 via the relay 49.

Accordingly, even with the fourth embodiment, operations and effects substantially similar to those in the second or the third embodiment can be achieved.

(Fifth Embodiment)

FIGS. 30 through 41 show a fifth embodiment of the present invention. Incidentally, portions the same as those in the first through the fourth embodiments are attached with the same reference numbers.

First, an explanation will be given of a problem which is resolved by the fifth embodiment. According to the first embodiment as mentioned above, in the first step, the Si wafer 11 is anisotropically etched while being applied the very small positive voltage V1 to a degree capable of subjecting the Si wafer 11 to anisotropic etching. As a result, impurities such as metal ions (for example, Pb) or the like included in the etching solution is difficult to be adsorbed onto the etching face. Therefore, even when the etching face of the Si wafer 11 is (110) face, the etching face is smoothed, the smoothness of the inner bottom portion 19a of the recess portion 19 is promoted and a variation in dimension of the inner bottom portion 19a is also reduced.

In this case, the magnitude of the voltage V1 applied to the Si wafer 11 is about 0 through 0.2 V when the Si wafer 11 is of a P-type, and the applied voltage must be controlled within the narrow voltage range. Therefore, in the case of the first embodiment, there is needed a system for finely carrying out voltage control for applying the very small positive voltage V1 to a degree capable of performing the anisotropic etching to the Si wafer 11.

Figure 31A:
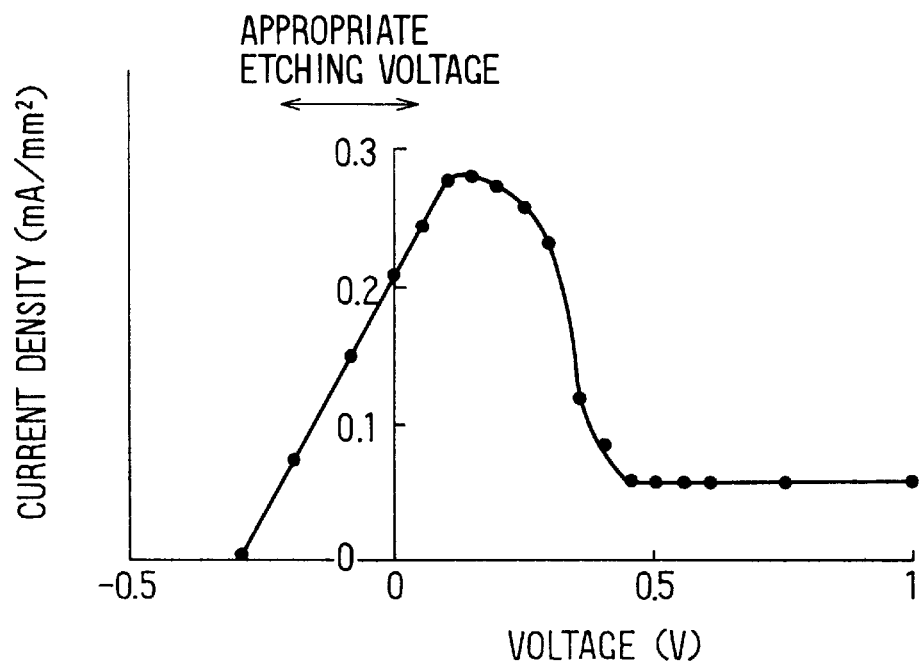
FIG. 31A is a characteristic diagram showing relationship between applied voltage and current density in an N-type Si wafer and FIG. 31B is a characteristic diagram showing relationship between applied voltage and etching rate in the N-type Si wafer.
Figure 31B:
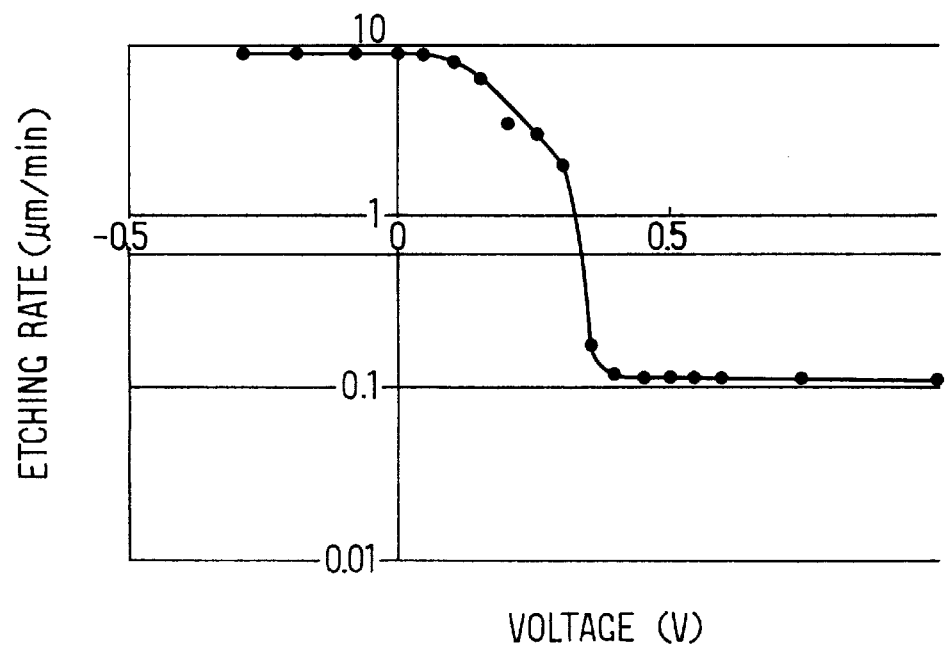

Further, when the Si wafer 11 is of an N-type, it has been found that the voltage V1 applied to the Si wafer 11 is a negative voltage and falls in a narrow voltage range of about −0.25 through −0.05 V. Results where the etching characteristics in respect of the voltage applied to the N-type Si wafer are obtained through an experiment, are shown in FIGS. 31A and 31B. FIG. 31A is a characteristic diagram showing relationship between the applied voltage and current density, and FIG. 31B is a characteristic diagram showing relationship between the applied voltage and the etching rate. Therefore, when the Si wafer 11 is of an N-type, accuracy of voltage control must further be increased.

Figure 33:
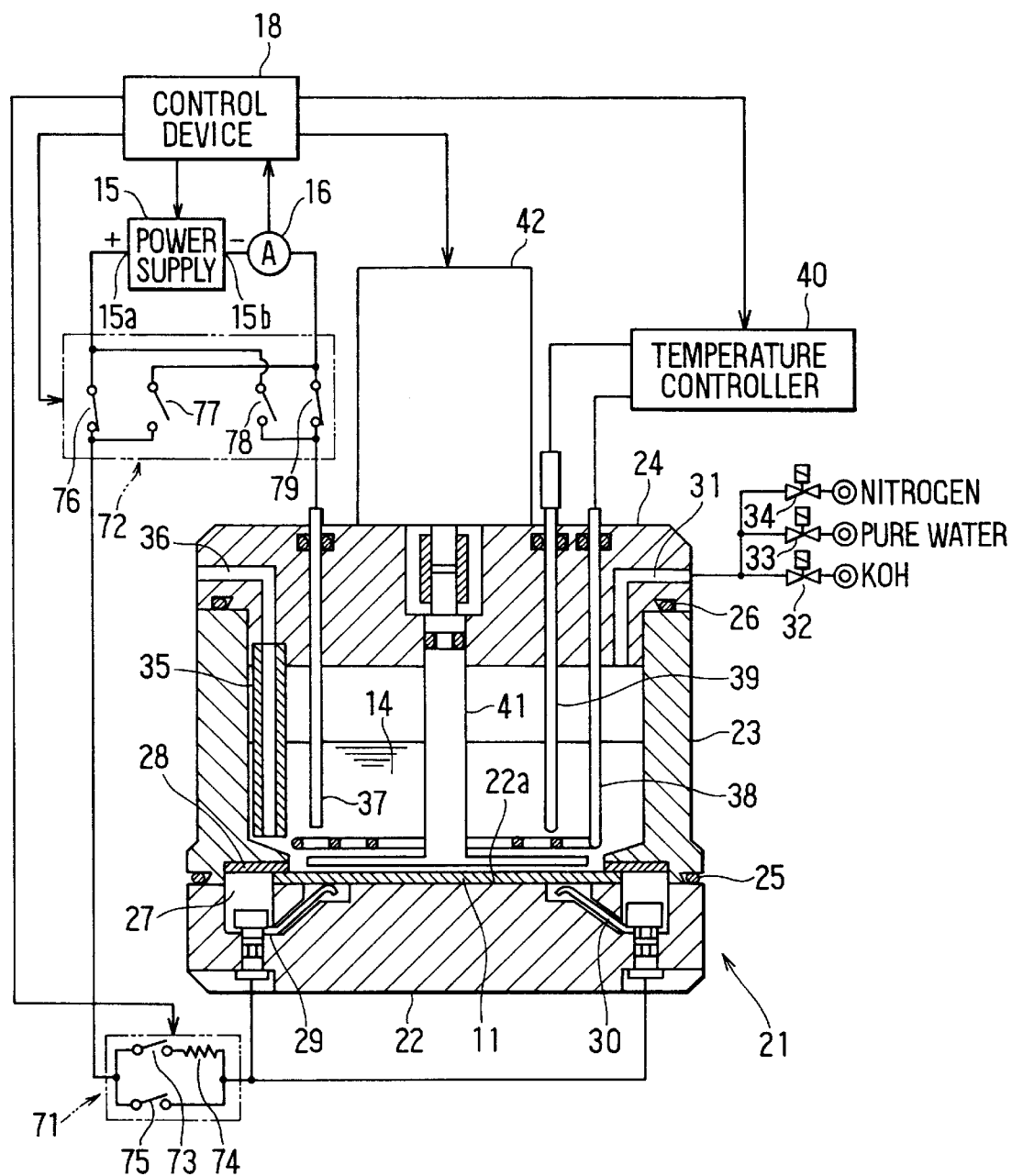
FIG. 33 is a sectional view of an etching device according to a fifth embodiment.

In order to resolve such problems, the inventors have invented an etching method as described in the fifth embodiment. According to the fifth embodiment, voltage is applied to the Si wafer 11 by connecting a resistor in series thereto. Specifically, the etching device 21 shown in FIG. 33 is used. The etching device 21 is a device where the basic constitution is substantially the same as the etching device 21 of the second embodiment shown in FIG. 12 and is different therefrom in the following points.

That is, one different point is that a resistor connection switching circuit 71 is installed between the base end portions of the anode electrodes 29 and 30 and the positive side terminal 15a of the variable power source circuit 15. Another different point is that a voltage polarity switching circuit 72 is installed between the both terminals 15a and 15b of the variable power source circuit 15 and the resistor connection switching circuit 71 as well as the cathode electrode 37.

The resistor connection switching circuit 71 is constituted by connecting in parallel a series circuit where a switching element 73 such as a transistor, relay and so on is connected in series with a resistor 74, and a switching element 75 such as a transistor, relay and so on. The two switching elements 73 and 75 are controlled by the control device 18 on ON/OFF control basis. The resistor 74 is provided with resistance of, for example, 20Ω.

In this case, when the switching element 73 is turned on and the switching element 75 is turned off, the resistor 74 is connected in series with the Si wafer 11. Further, when the switching element 73 is turned off and the switching element 75 is turned on, the resistor 74 is not connected to the Si wafer 11.

Meanwhile, the voltage polarity switching circuit 72 is constituted by connecting four switching elements 76, 77, 78 and 79 each formed from a transistor, relay and so on as shown in FIG. 33. According to the voltage polarity switching circuit 72, when the switching elements 76 and 79 are turned on and the switching elements 77 and 78 are turned off, a positive voltage is applied to the Si wafer 11.

Figure 30:
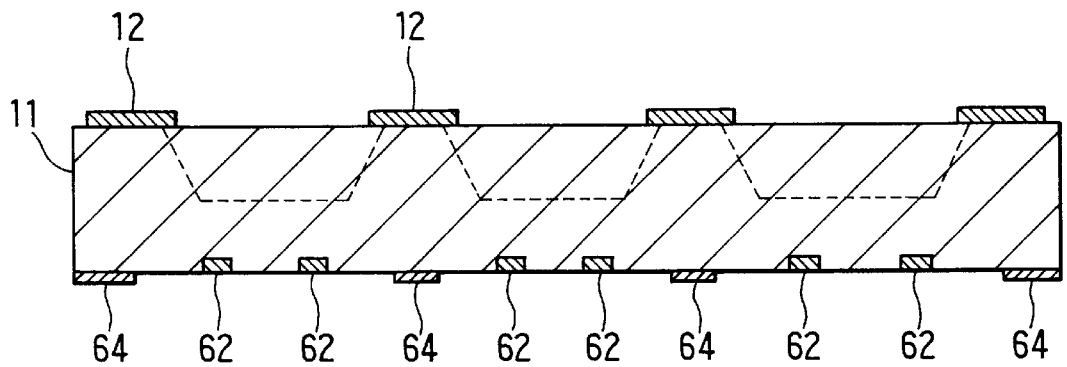
FIG. 30 is a sectional view of an Si wafer according to a fifth embodiment of the present invention.

The Si wafer 11 of N-type is etched by using the etching device 21 having the above-described constitution. A simple explanation will be given of the Si wafer 11 of N-type in reference to FIG. 30. As shown in FIG. 30, the gages 62 having a predetermined shape are formed on the lower face of the Si wafer 11 of N-type, and the electricity feeding electrodes 64 made of aluminum are formed to constitute, for example, substantially a lattice shape as a whole. Further, the etching mask 12 composed of, for example, $SiO_2$, SiN or the like is formed on the upper face of the Si wafer 11 of N-type.

An explanation will be given of the etching operation when the etching is carried out by using the etching device 21 shown in FIG. 33. When the Si wafer 11 is immersed in an alkaline etching solution in opposition to the Pt electrode 37 and voltage is applied, if the voltage is equal to or lower than a predetermined value, anisotropic etching progresses. To contrary, if the voltage is equal to or larger than a predetermined value, the Si wafer 11 is anodically oxidized. When the Si wafer 11 is anodically oxidized, an oxide film is formed on the etching face of the Si wafer 11 and the oxide film is etched little by little by alkali. Therefore, very mild isotropic etching progresses.

Meanwhile, when a very small voltage is applied, basically, anisotropic etching progresses. However, in this anisotropic etching, the etching face is more smoothed and a ratio of etching rates of respective faces is changed, compared with a case where voltage is not applied. Further, when the predetermined voltage is applied, a variation in etching rates of (100) face and (110) face caused by a very small amount of a metal impurity (Pb or the like) included in the etching solution can be cancelled. However, when the applied voltage is increased, micro pyramids are liable to occur on the etching face, the anisotropy finally disappears and the Si wafer is anodically oxidized.

In this case, when the anisotropic etching solution 14 which is an aqueous solution of KOH having the concentration of 32 wt % at temperature of, for example, 110° C. is used and voltage is applied to the N-type Si wafer 11 in a state where the resistor 74 is not connected, that is, the switching element 73 is turned off and the switching element 75 is turned on, the etching characteristic diagrams as shown by FIGS. 31A and 31B are obtained by measuring the initial current density and the etching rate of (110) face that is the etching face. Incidentally, the N-type Si wafer 11 having the resistivity of 0.6 through 1.2 Ω·cm is used.

The etching characteristics are varied in accordance with the conditions of etching, kind of the wafer (kind and concentration of impurity included therein) as well as resistance in a power feeding circuit system including various contact resistances and so on. In this case, when, for example, the same kind of wafers are used and an etching mask pattern stays the same, the factor of variation in the etching characteristics is dependent on the resistance in the power feeding circuit. However, the etching characteristics such as an etching rate or the like remain constant under the same initial current density in the case of no resistance and in the case of resistance of 20Ω, as shown in FIGS. 31A and 31B.

Accordingly, the etching characteristics in a voltage region where current changes substantially linearly with respect to the change of voltage, are determined by the initial current (density) of the etching face. Therefore, when current at an initial stage of etching is controlled, the repeatability of etching can be ensured. Accordingly, it is necessary to control the current density at an initial stage of etching, that is, a value of current divided by an etched area.

Figure 35:
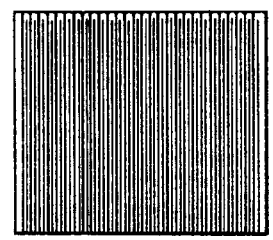
FIGS. 35 through 38 are views showing a condition of an etching faces.
Figure 36:
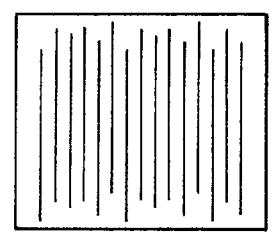
Figure 37:
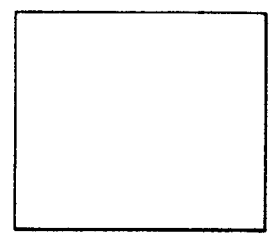
Figure 38:
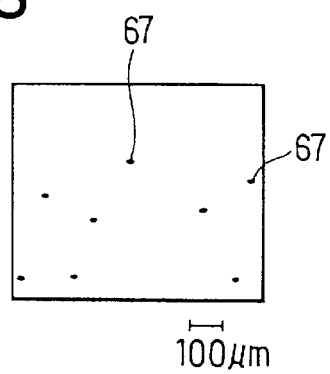
Figure 34:
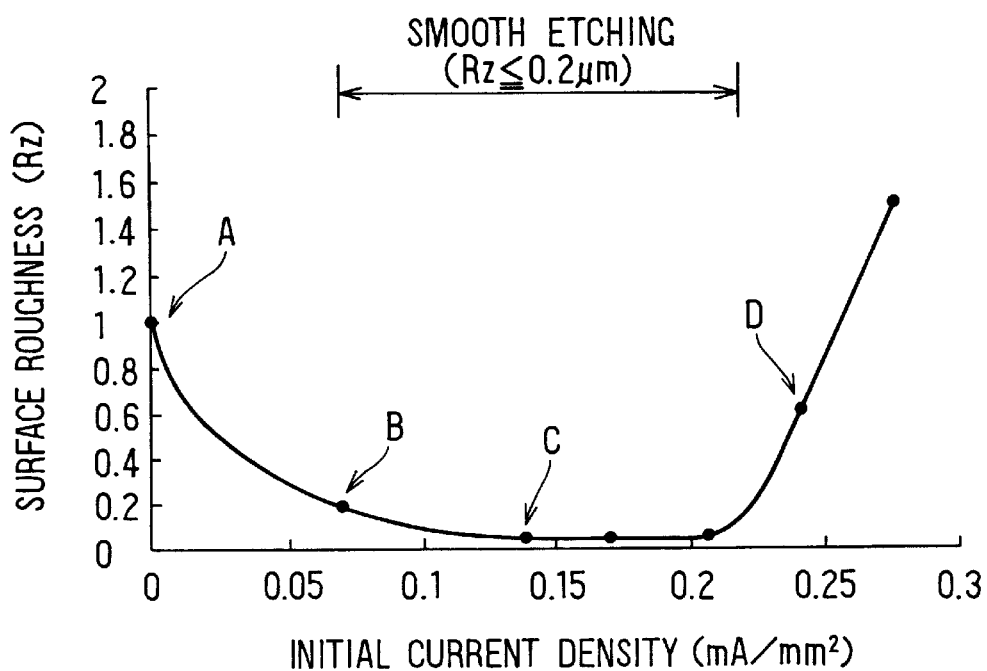
FIG. 34 is a graph showing a relationship between roughness of an etching face of an N-type Si wafer and initial current density.

The roughness of the etching face ((110) face) in respect of the current density in the initial stage is shown in a graph of FIG. 34. Further, the condition of the etching face at point A in FIG. 34, that is, in the case where the initial current density is 0 (case where voltage is not applied) is shown in FIG. 35. Further, the condition of the etching face at point B in FIG. 34, that is, in the case where the initial current density is substantially 0.07 mA/mm$^2$ is shown in FIG. 36. Further, the condition of the etching face at point C in FIG. 34, that is, in the case where the initial current density is substantially 0.14 mA/mm$^2$ is shown in FIG. 37. Furthermore, the condition of the etching face at point D in FIG. 34, that is, in the case where the initial current density is substantially 0.24 mA/mm$^2$ is shown in FIG. 38. FIGS. 35 through 38 are views schematically drawing photographs taking pictures of the etching faces.

Figure 39:
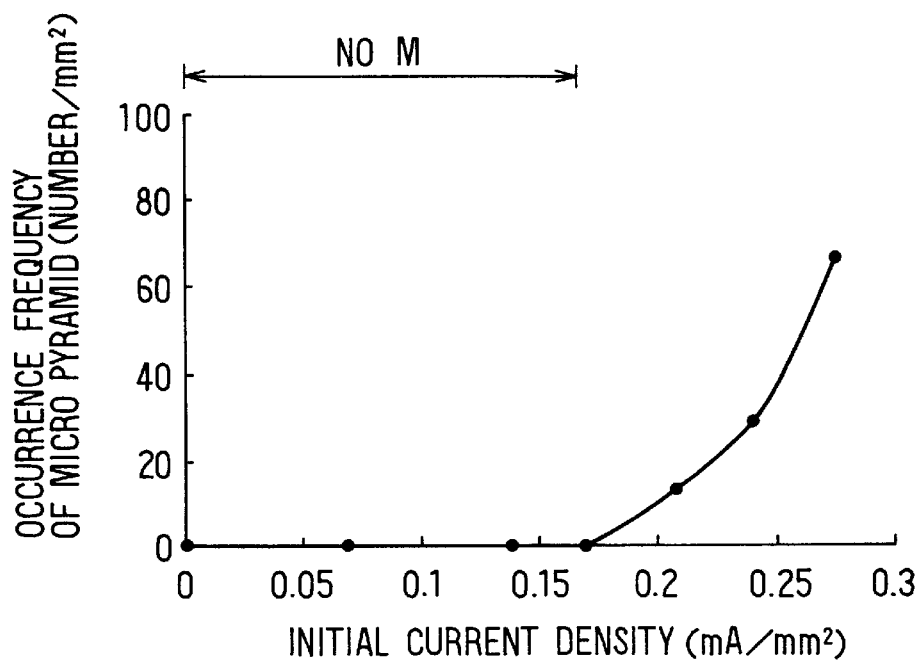
FIG. 39 is a graph showing relationship between frequency of micro pyramids of an N-type Si wafer and initial current density.

The occurrence frequency of micro pyramids on the etching face in respect of the initial current density is shown in a graph of FIG. 39. Further, a ratio of etching rates of (100) face and (110) face in respect of the initial current density is shown in a graph of FIG. 40.

Figure 40:
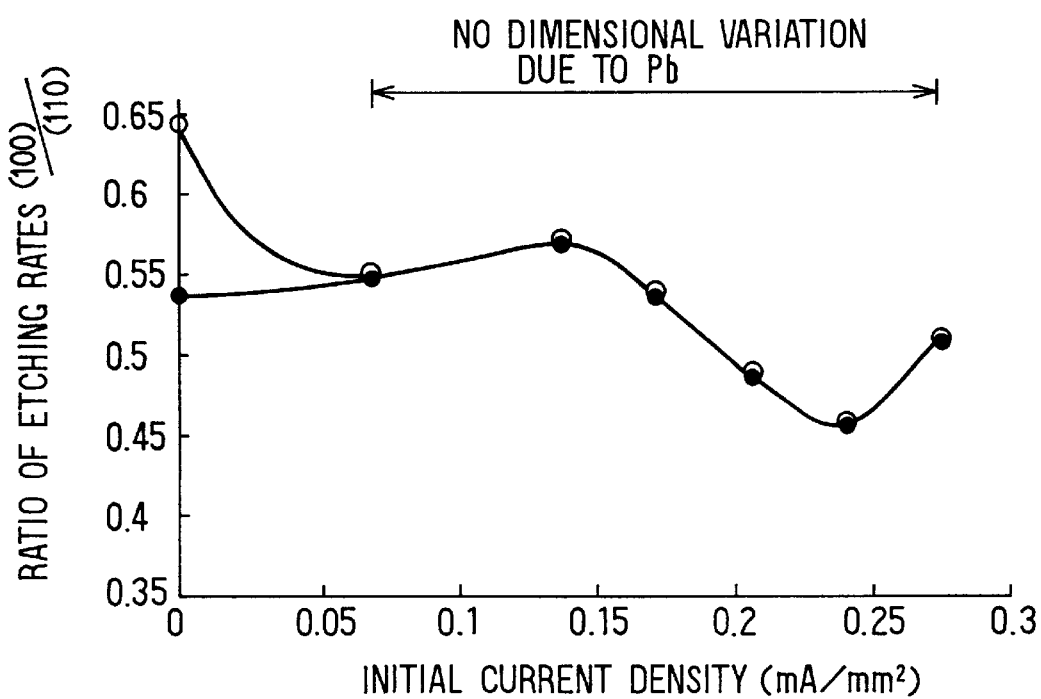
FIG. 40 is a graph showing relationship between initial current density and a ratio of etching rates of an N-type Si wafer.

It is known from FIGS. 34, 39 and 40 that the initial current density of the etching face is preferably controlled to fall in a range of 0.07 through 0.17 mA/mm$^2$ to reduce dimensional variation caused by influence of a very small amount of metal impurities such as Pb or the like included in the etching solution and to form a flat and smooth diaphragm. Further, as shown in FIG. 31A, it is necessary to apply a negative voltage of −0.2 through −0.05 V to provide the current density in the above-described range when the etching is carried out in a state where resistance of a power feeding circuit is small, that is, in a state where the resistor 74 is not connected.

However, in another etching step, there is a case where a large positive voltage compared with the very small negative voltage as mentioned above must be applied. For example, the positive voltage of, for example, about 1 through 3 V needs to be applied to the Si wafer 11 when the Si wafer 11 is anodically oxidized in order to stop the etching operation until temperature of the etching solution is stabilized at the initial stage of etching or to round an end portion of a diaphragm after etching. In such a case, the polarity of the applied voltage must be switched, and the negative voltage having considerably small value in the above-described range must be applied when the negative voltage is to be applied. Therefore, to constantly control the current densities in the respective cases, considerably difficult voltage control is required.

Figure 32A:
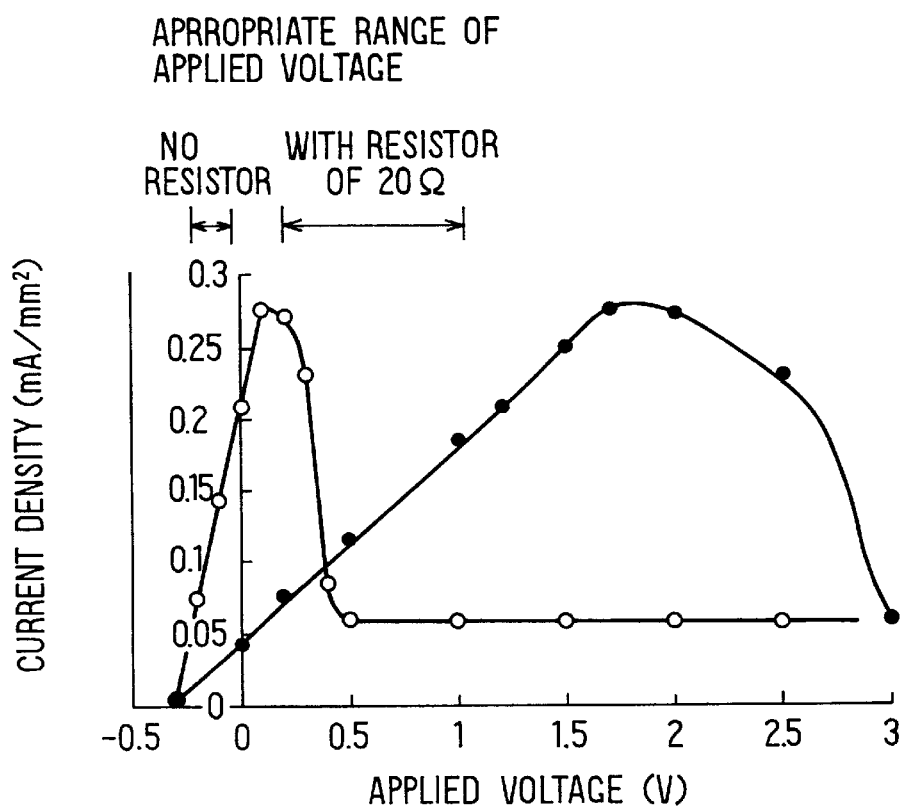
FIGS. 32A and 32B are characteristic diagrams showing etching characteristics of an N-type Si wafer in accordance with presence or absence of a resistor.
Figure 32B:
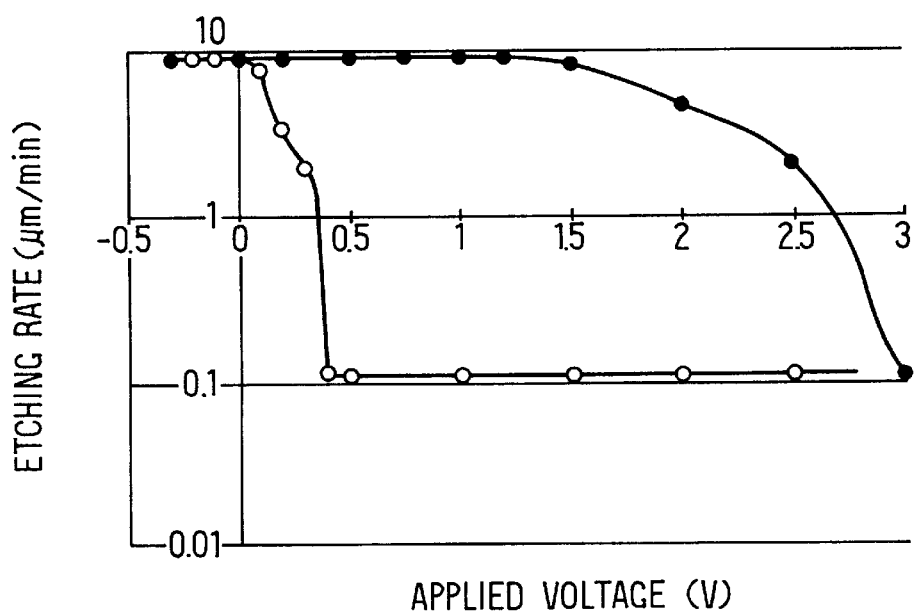

According to the fifth embodiment, voltage control can be carried out only by positive voltage by installing the resistor 74 of 20Ω in the power feeding circuit. When the anisotropic etching solution 14 which is an aqueous solution of KOH having concentration of 32 wt % at temperature of, for example, 110° C., is used, in a state where the resistor 74 is connected, that is, in a state where the switching element 73 is turned ON and the switching element 75 is turned OFF, and when voltage is applied on the Si wafer 11 of an N-type, the initial current density and the etching rate of (110) face which is the etching face, are measured. As a result, the etching characteristic diagrams shown by black circles and curves connecting the black circles shown in FIGS. 32A and 32B are obtained. It is to be noted that the Si wafer 11 of an N-type having the resistivity of 0.6 through 1.2 Ω·cm is used in the above measurement. Further, the etching characteristics shown by white circles and curves connecting the white circles shown in FIGS. 32A and 32B indicate a case where the resistor 74 is not connected.

As shown in FIG. 32A, when the resistor 74 is connected, a range of the applied voltage for setting the initial current density of the etching face in a pertinent range of 0.07 through 0.17 mA/mm$^2$, is shifted to the positive potential side and expanded to 0.2 V through 1.0 V. Accordingly, the range of the applied voltage is set in a range of the positive voltage the same as the applied voltage for anodic oxidation as well as becomes wide, whereby voltage control is comparatively easy.

In contrast thereto, in the case where the etching operation is stopped at an initial stage of etching until temperature of the etching solution is stabilized or the Si wafer 11 is anodically oxidized to round an end portion of a diaphragm after etching, it is preferable that a resistance value of the resistor 74 is small, because the applied voltage can be reduced. Accordingly, in such a case, when the circuit is switched in such a manner that resistance value of the resistor 74 to be connected is reduced or the resistor 74 is not connected, a general range of the applied voltage can be reduced and the controllability of voltage is promoted by that amount.

Next, an explanation will be given of a method of controlling the initial current density. When the etching is carried out by applying a very small voltage, current (density) in etching is gradually changed in accordance with a change in the shape of the diaphragm by the progress of etching. At an early stage of etching, the object to be etched is only (110) face and accordingly, current stays substantially constant depending on the applied voltage. However, there causes a dispersion in current by contact resistance, concentration of impurities of a silicon substrate or the like. Therefore, the applied voltage may be adjusted such that the initial current density (actually current value) becomes a predetermined value.

For example, when the etching device 21 as shown in FIG. 33 is used, several minutes is required until the solution temperature reaches a target value (for example, 110° C.) from when a heated etching solution is put into the frame 23 and the etching operation is started. During the time period, a voltage of about 1 V is applied when, for example, the resistor 74 is not connected, to prevent the etching operation from being progressed. Further, at a time point where the solution temperature reaches the target value and is stabilized, the resistor 74 of 20Ω is connected. The voltage applied to the Si wafer 11 is set to 0.2 through 1 V. At this time, current flowing in the power feeding circuit is monitored (detected), and the voltage is controlled in such a manner that the current density falls in a pertinent range (0.07 through 0.17 $mA/mm^2$).

It is to be noted that, when the etching device 21 is used, there are factors of variation which cannot be controlled such as the resistivity of the Si wafer 11 per se, contact resistances between the Si wafer 11 and the power feeding electrodes 29 and 30 and so on. Therefore, when the voltage is applied to the Si wafer 11 at the initial stage of etching, current flowing therein is measured and thereafter, the applied voltage is finely adjusted in such a manner that the current falls in a predetermined value (pertinent range) as mentioned above, the controllability is enhanced.

Next, an explanation will be given of conditions of etching when a diaphragm having a thickness of 30 μm is formed in the Si wafer 11 of an N-type having the original thickness of 300 μm. First, in a state where the resistor 74 is not connected, a first voltage of, for example, 1 V is applied for, for example, 10 minutes and the Si wafer 11 is anodically oxidized until temperature of the etching solution is stabilized. Thereafter, the resistor 74 is connected to the anode electrodes 29, 30 by switching the resistor connection switching circuit 71, and a voltage of, for example, 1 V is supplied from the variable power source circuit 15. In this state, the value of the current flowing in the Si wafer 11 is monitored. The applied voltage is finely adjusted in such a manner that the current density becomes, for example, 0.14 $mA/mm^2$. Then, the etching is continued for, for example, 29 minutes at the voltage.

Thereafter, water is injected into the frame 23 constituting the etching tank, the etching solution is diluted and cooled by which the etching operation is finished. In this case, in order to round an end portion of the diaphragm, the first voltage (for example, 1 V) may again be applied without connecting the resistor 74 before injecting water. When the etching is carried out under such conditions, the etching face is smoothed (surface roughness Rz; 0.2 or lower) and further, a diaphragm having small dimensional variation (±10 μm or less) can stably be formed (manufactured).

Figure 41A:
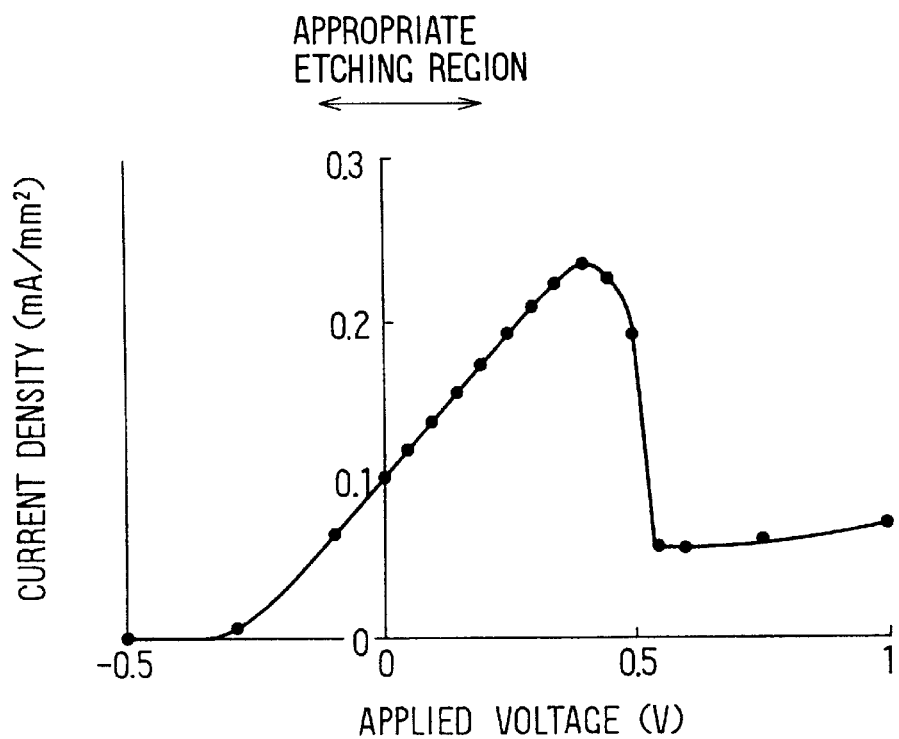
FIGS. 41A and 41B are characteristic diagrams showing etching characteristic of a P-type Si wafer.
Figure 41B:
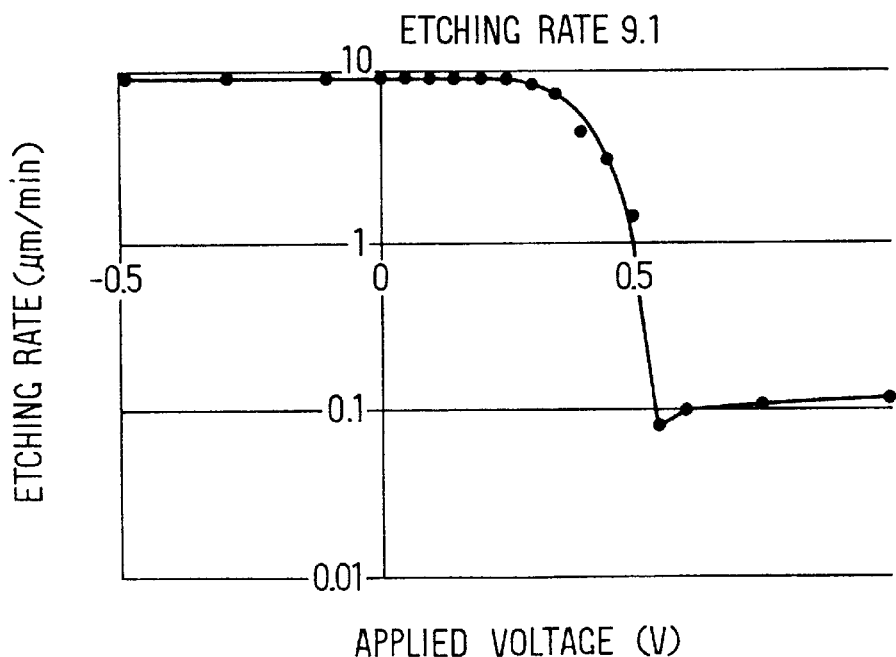

Meanwhile, when the Si wafer 11 of a P-type is etched, the resistor 74 may not be connected when anisotropic etching is carried out on the Si wafer 11 in the first step. In the case of the Si wafer 11 of a P-type having a resistivity of 10 through 20 Ω·cm, graphs of FIGS. 41A and 41B are obtained by investigating the etching characteristics in respect of the applied voltage by an experiment under a condition of no resistor. Accordingly, even with no resistor, an appropriate applied voltage falls in a range of −0.1 through 0.2 V and accordingly, the positive voltage region is sufficiently included in the appropriate voltage range. That is, it is not necessary to apply negative voltage, and it is not necessary to switch polarity of the applied voltage. Therefore, control of the voltage can be performed without connecting the resistor 74.

Further, also in the case of the P-type Si wafer, similar to the case of the N-type Si wafer, when the Si wafer 11 is subjected to the anisotropic etching in the first step, etching control may be carried out by connecting the resistor 74. As a result, when the resistor 74 is connected, the appropriate voltage range is widened (shifted to positive voltage side and widened) and accordingly, the controllability of the applied voltage is promoted by that amount.

Although, in the above-described embodiment, the connection of the resistor 74 is switched by the resistor connection switching circuit 71, the present invention is not limited thereto but connection of a plurality of resistors may be switched. Further, it is preferable to make resistance value of a resistor connected in series to the Si wafer 11 to a desired value.

(Sixth Embodiment)

Figure 50:
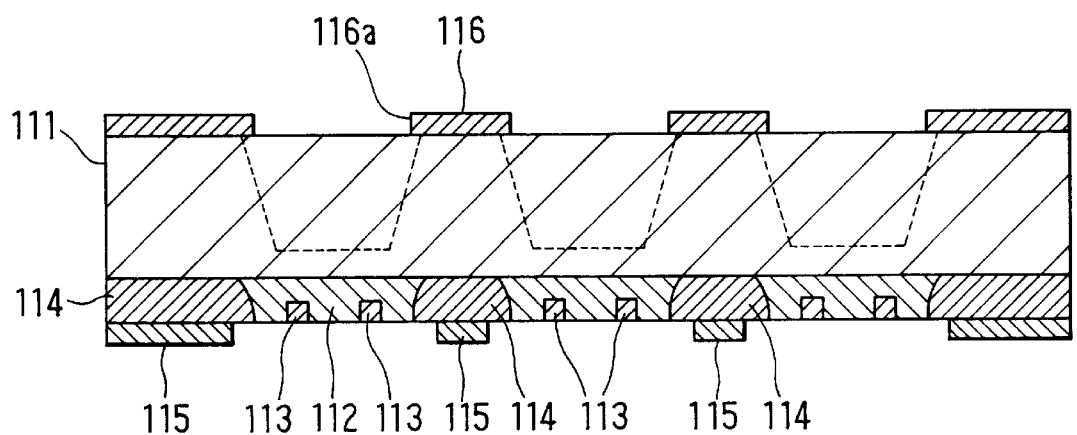
FIG. 50 is a longitudinal sectional view of an Si wafer.

An explanation will be given of a sixth embodiment of the present invention in reference to FIG. 42 through FIGS. 54A–54C as follows. First, a simple explanation will be given of an Si wafer used in the sixth embodiment in reference to FIG. 50. An Si wafer 111 is formed from, for example, a P-type silicon wafer (for example, having resistivity of 10 through 20 Ω·cm). An N-type Si layer (N epitaxial layer) 112 is formed on a lower face of the P-type silicon wafer in FIG. 50 by, for example, CVD. Further, in the N-type Si layer 112, gages 113 of $P^+$-type in a predetermined shape are formed and $P^+$ isolation layers 114 are also formed. On lower faces of the $P^+$ isolation layers 114, power supplying electrodes 115 made of aluminum are formed to constitute, for example, substantially a lattice shape as a whole.

Figure 46:
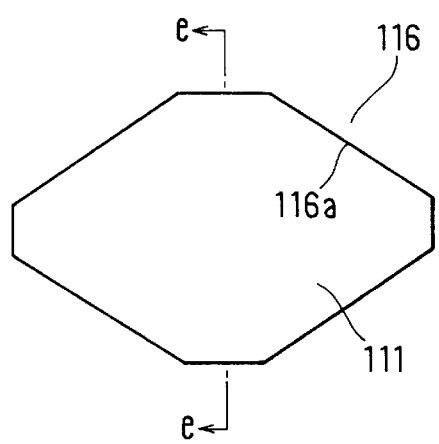
FIG. 46 is a top view of an Si wafer before etching.
Figure 47:
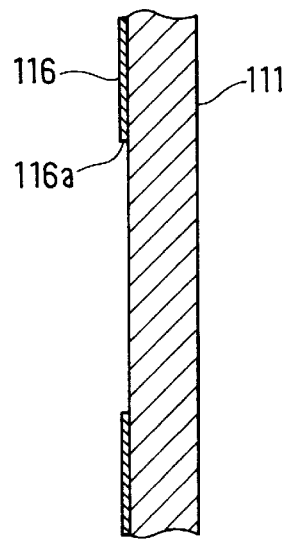
FIG. 47 is a sectional view taken along a line e—e of FIG. 46.

Further, on an upper face of the Si wafer 111, an etching mask 116 composed of, for example, $SiO_2$, SiN or the like is formed. As shown in FIGS. 46 and 47, an opening portion 116a of an octagonal shape which is necessary for forming an Si diaphragm in an octagonal shape, is formed in the etching mask 16. It is to be noted that, as the Si wafer 111, an N-type silicon wafer and a P-type silicon wafer (having no N layer) can be used, other than the P-type silicon wafer (having N layer) mentioned above.

To etch the Si wafer 111, according to the embodiment, the etching device 21 having the constitution shown in FIG. 33 is used.

An explanation will be given of the operation when the Si wafer 111 is etched by using the etching device 21. The Si wafer 111 is set in the etching device 21 as shown in FIG. 33. The alkaline etching solution 114 is supplied into the hermetically-sealed vessel, the upper face of the Si wafer 111 is brought into contact with (immersed in) the alkaline etching solution 114. The voltage is applied from the variable power source circuit 15 on the Si wafer 111 by which the etching operation is carried out.

Figure 51A:
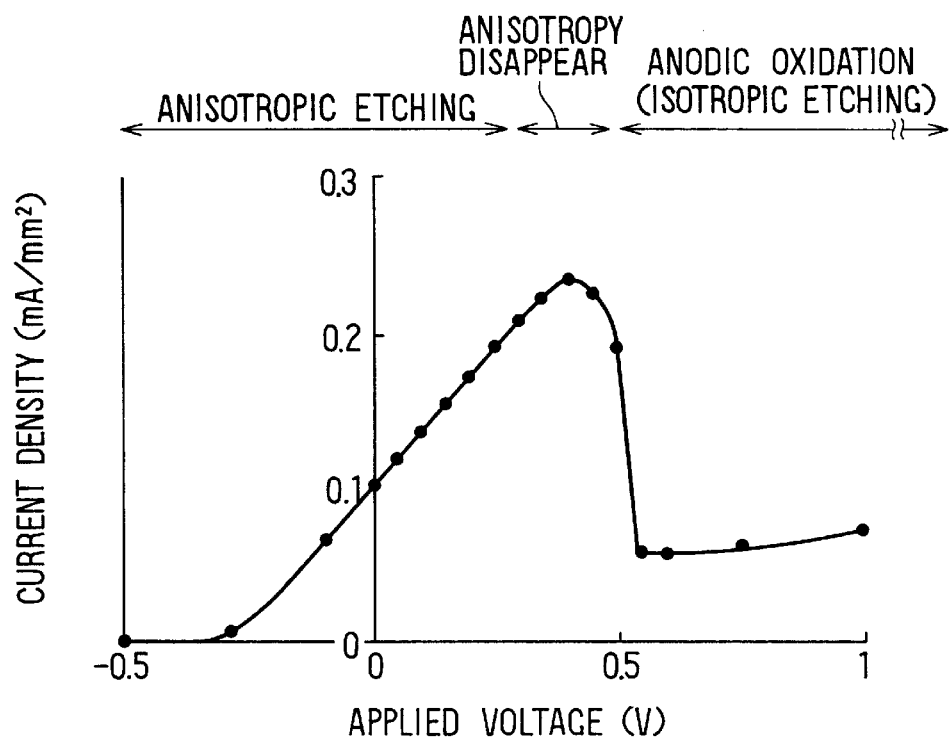
FIG. 51A is a characteristic diagram showing relationship between applied voltage and current density in etching characteristic of a P-type Si wafer and FIG. 51B is a characteristic diagram showing relationship between applied voltage and etching rate in etching characteristic of a P-type Si wafer.
Figure 51B:
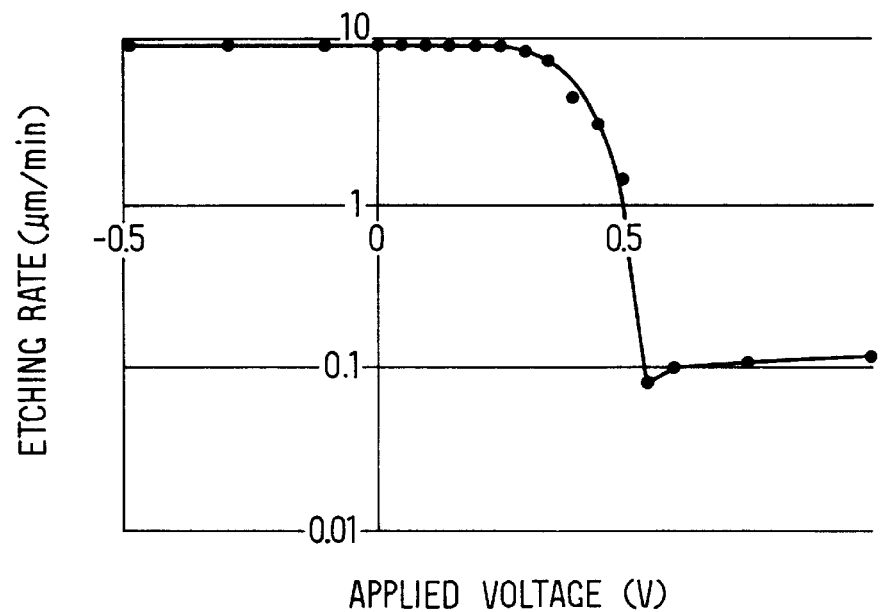

In this case, as shown in FIG. 51A, when the applied voltage is equal to or lower than a predetermined value, the anisotropic etching progresses. When the applied voltage is equal to or larger than a predetermined value, the Si wafer 111 is anodically oxidized. When the Si wafer 111 is anodically oxidized, an oxide film is formed on the Si wafer 111 and the oxide film is etched little by little by the alkaline etching solution 114. Accordingly, very mild isotropic etching progresses.

Meanwhile, in a case where the applied voltage is very small, although the anisotropic etching is basically progressed, etching rates of respective faces of the Si wafer 111 are changed compared with that in the case where voltage is not applied. For example, 32 wt % KOH is used as the alkaline etching solution 14 and the applied voltage is changed in a state where the solution temperature is set to 110° C., by which current flowing in the Si wafer 111, that is, the initial current density of (110) face constituting the etching face of the Si wafer 111 is changed. At this time, relationship between the initial current density and a ratio of a etching rate in the surface ((311) face) of an inclined face portion 150 mentioned later (refer to FIG. 42 and FIG. 45) relative to that in (110) face, is derived. The derived relationship (etching characteristic) is shown in a graph of FIG. 52.

The etching characteristic is varied in accordance with conditions of etching, kind of a wafer (kind and concentration of impurities) as well as resistance in a power feeding circuit system including various contact resistances and so on. However, it has been confirmed as mentioned later that the etching characteristic in a voltage region where the current are changed substantially linearly with respect to the change of voltage, is determined by the initial current (density) of the etching face. Accordingly, in controlling the etching operation, it is necessary to control the initial current density of the etching face, specifically, a value produced by dividing current value by an etched area as a parameter. Hence, in respect of the etching operation (etching characteristic) explained thereafter, an explanation will be given with the initial current density as a parameter.

Figure 42:
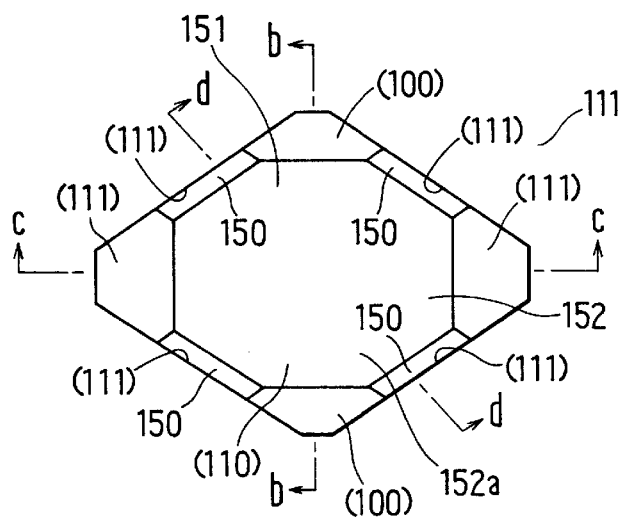
FIG. 42 is a top view of an Si diaphragm according to a sixth embodiment of the present invention.
Figure 43:
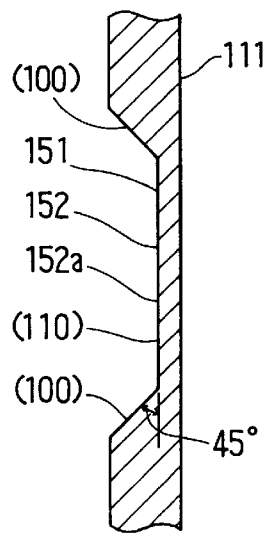
FIG. 43 is a sectional view taken along a line b—b of FIG. 42.
Figure 44:
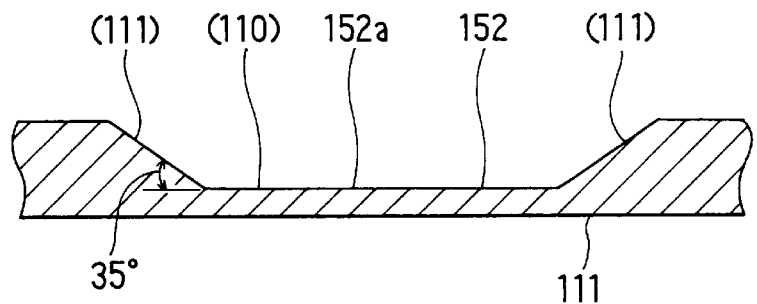
FIG. 44 is a sectional view taken along a line c—c of FIG. 42.
Figure 48:
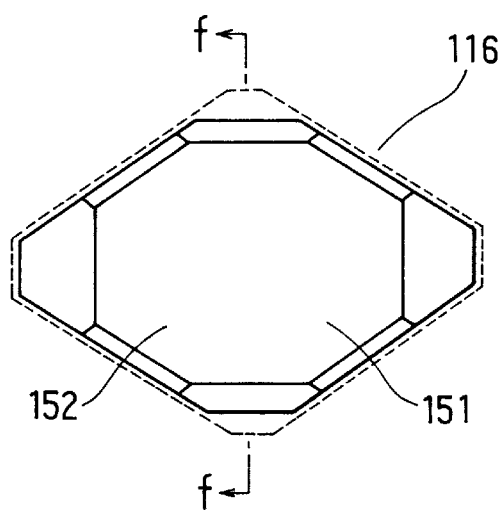
FIG. 48 is a top view of an Si wafer after etching.
Figure 58:
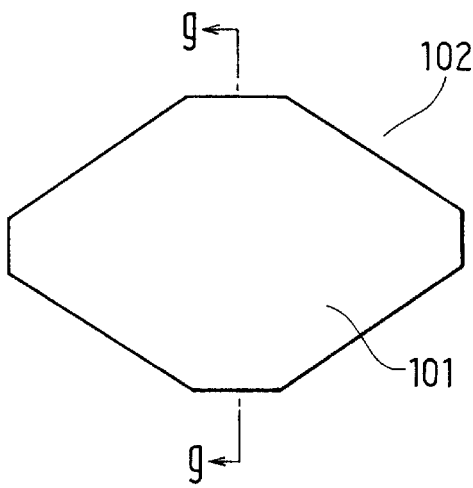
FIG. 58 is a top view of a conventional Si wafer before etching.
Figure 49:
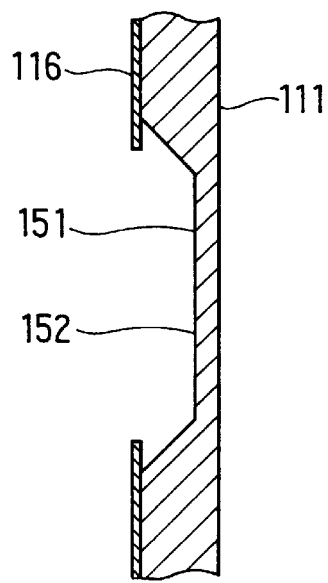
FIG. 49 is a sectional view taken along a line f—f of FIG. 48.
Figure 59:
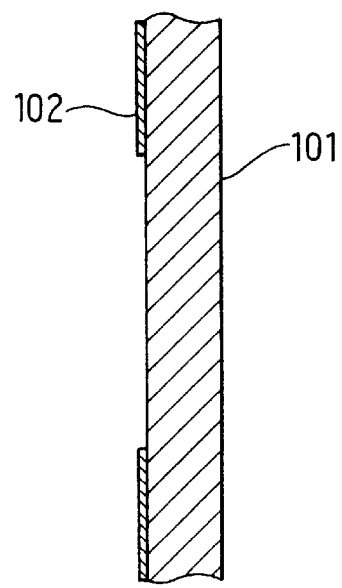
FIG. 59 is a sectional view taken along a line g—g of FIG. 58.
Figure 62:
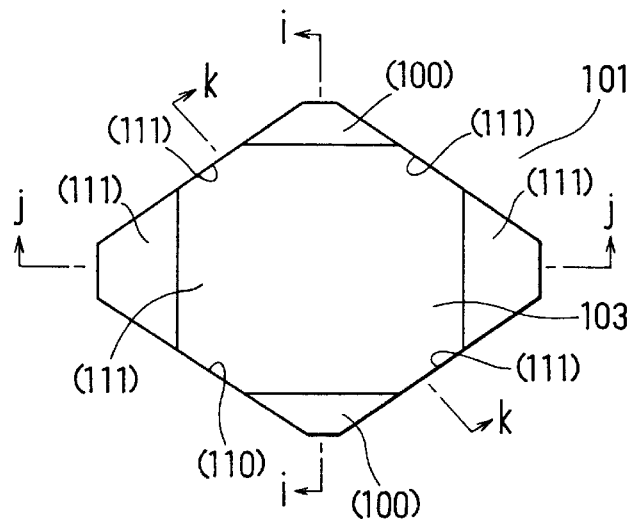
FIG. 62 is a top view of a conventional Si diaphragm.
Figure 61:
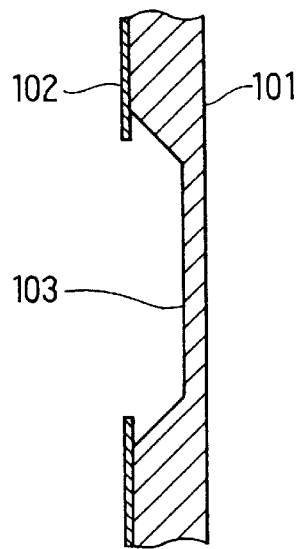
FIG. 61 is a sectional view taken along a line h—h of FIG. 60.
Figure 63:
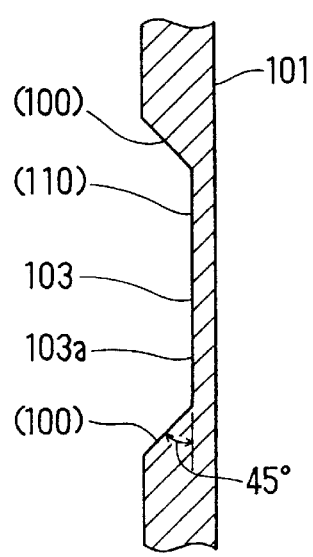
FIG. 63 is a sectional view taken along a line i—i of FIG. 62.
Figure 64:
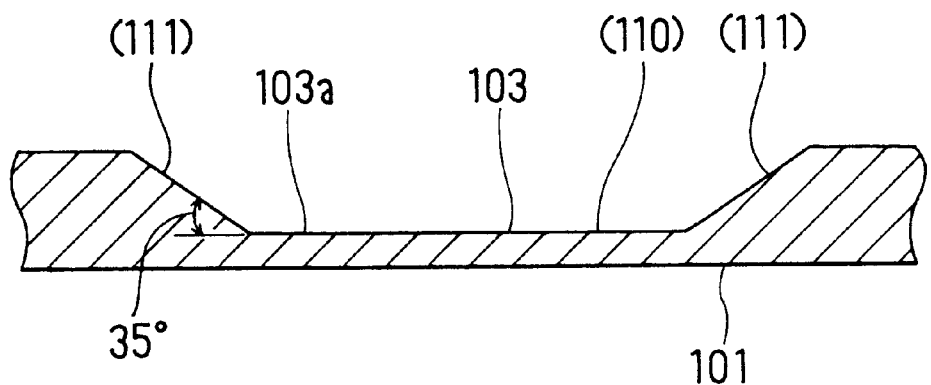
FIG. 64 is a sectional view taken along a line j—j of FIG. 62.

The anisotropic etching is progressed by setting the initial current density to 0.17 mA/mm$^2$ through 0.21 mA/mm$^2$ by applying, for example, a positive voltage of 0.2 through 0.3 V to the Si wafer 111. Then, as shown in FIGS. 48 and 49, a recess portion 151 is formed on the upper face of the Si wafer 111. A bottom wall portion of the recess portion 151 constitutes a diaphragm 152. In this case, the Si wafer 111 in a state where the etching mask 116 has been removed is shown in FIGS. 42 through 45. Among them, as shown in FIGS. 42 through 44, shapes of upper and lower (100) faces in FIG. 42 and left and right (111) faces in FIG. 42 among inner faces of the recess portion 151 of the Si wafer 111, that is, angles of intersecting the above-described respective faces with a diaphragm face 152*a* are the same as those in the conventional example (FIG. 62 through FIG. 64).

Figure 45:
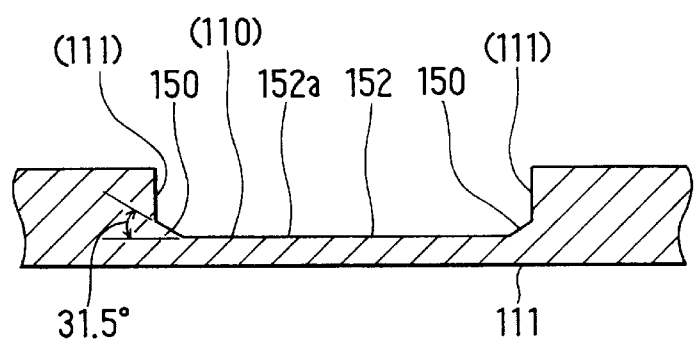
FIG. 45 is a sectional view taken along a line d—d of FIG. 42.
Figure 65:
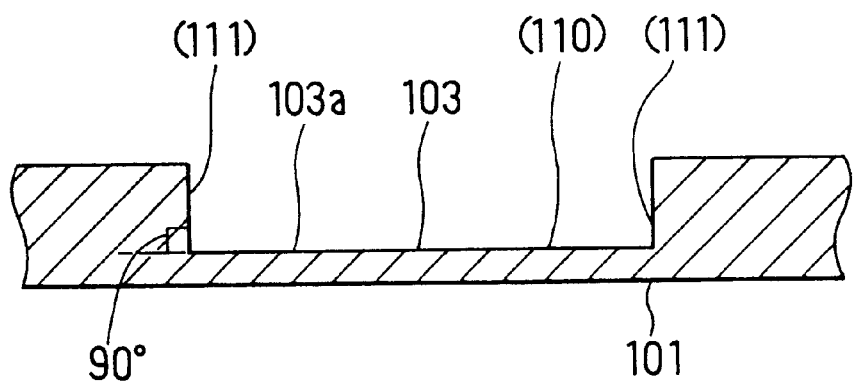
FIG. 65 is a sectional view taken along a line k—k of FIG. 62.

However, in the case of the sixth embodiment, as shown in FIGS. 42 and 45, inclined face portions 150 in a taper shape are formed between four (111) faces orthogonal to the diaphragm face 152*a* and the diaphragm face 152*a*. The inclined face portion 150 is a face intersecting with (110) face constituting the diaphragm face 152*a* by substantially 31.5° (also refer to FIG. 53B). Accordingly, it is predicted to be (311) face. By forming the inclined face portion 150, a corner portion (that is, corner portion where (110) face is orthogonal to (111) face) present in the conventional Si diaphragm shown by FIGS. 62 and 65 can be eliminated. Thereby, according to the Si diaphragm 152 of the embodiment, the peripheral edge portion thereof can have no portion where stress is concentrated.

Figure 52:
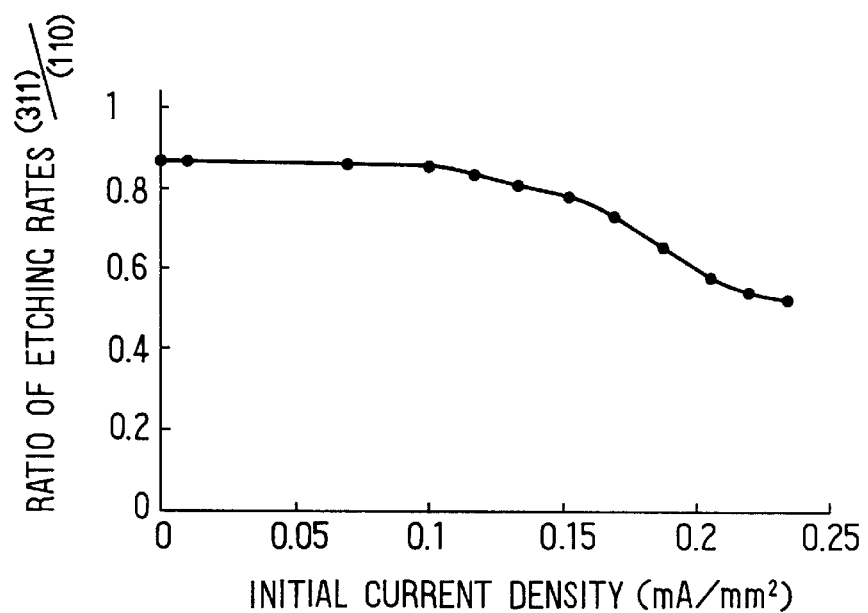
FIG. 52 is a characteristic diagram showing relationship between initial current density and a ratio of etching rates.

As shown by FIG. 52, a ratio of an etching rate of the taper face ((311) face) of the inclined face portion 150 with respect to that of the etching face (that is, (110) face) is changed in correspondence with the initial current density of the etching face. Therefore, by adjusting the initial current density (that is, applied voltage), the ratio of the etching rates of the taper face and the etching face can be controlled.

Incidentally, the phenomenon mentioned above is a characteristic phenomenon caused in a region before the anisotropic etching transits to the anodic oxidation by increasing the applied voltage (range of initial current density of 0.1 through 0.25 mA/mm$^2$ in FIG. 52).

Figure 53A:
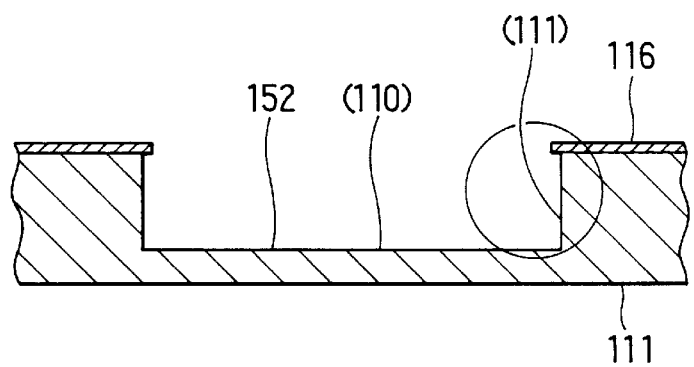
FIGS. 53A and 53B are views for explaining etching operation when an inclined face portion is formed.
Figure 53B:
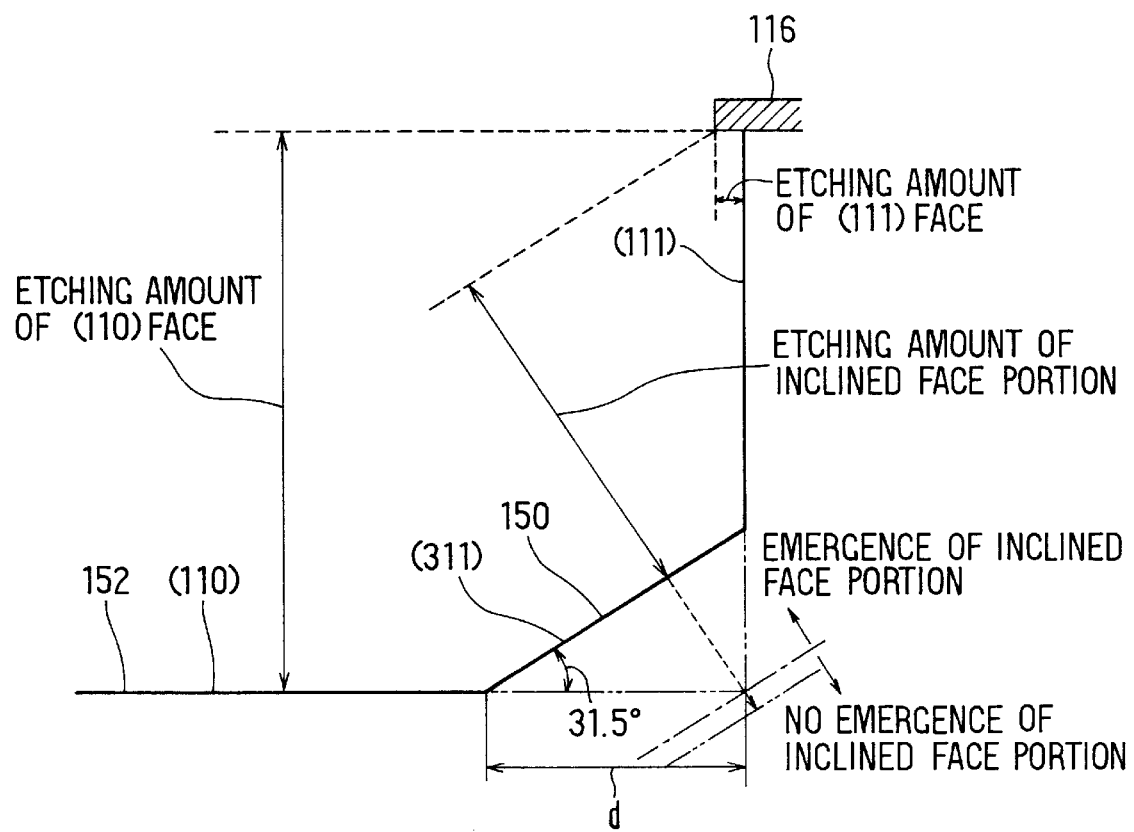

An investigation will be given of conditions of forming the inclined face portion 150 in reference to FIGS. 53A and 53B. The conditions of forming the inclined face portion 150 are determined by the respective etching rates of (110) face, (111) face and the taper face ((311) face) which is the surface of the inclined face portion 150. The etching rate of (111) face falls in a range of 0.15 through 0.25 μm/min regardless of the applied voltage and is very small compared with the etching rates of the other two faces. Accordingly, whether the inclined face portion 150 emerges (is formed) is determined by a ratio of the etching rate of the taper face of the inclined face portion 150 with respect to the etching rate of the etching face ((110) face) (that is, the ratio of etching rates of the two faces).

In this case, in order to form the inclined face portion 150, the ratio of the etching rates of the two faces needs to be set to at least 0.85 or lower (region of initial current density of 0.1 mA/mm$^2$ or higher in FIG. 52). The inclined face portion starts emerging from this value. Further, the smaller the ratio of the etching rates of the two faces, the larger the amount of the inclined face portion 150 to be projected. The amount of projection is an amount of the inclined face portion 150 projected from (111) face and is an amount designated by dimension "d" in FIG. 53B. It is preferable that the initial current density is equal to or larger than 0.15 mA/mm$^2$ in order to increase the amount of the projected inclined face portion 150.

Next, an explanation will be given of a method of controlling the initial current density. When the etching is carried out by applying a very small voltage on the Si wafer 111, current (density) flowing during the etching operation is gradually changed in accordance with a change in the shape of the recess portion 151 (diaphragm 152) along with the progress of the etching operation. However, at an initial stage of etching, the object of etching is only (110) face and accordingly, current becomes substantially constant depending on the voltage applied to the Si wafer 111. Further, the above-described current more or less disperses by a disperse in contact resistance and resistance in the wafer. Hence, current flowing in the Si wafer 111 may be detected and the applied voltage may be adjusted in such a manner that the current becomes a predetermined value. For example, when the etching device 21 of FIG. 33 is used, the applied voltage may be adjusted while the current detector 16 detects (monitors) the current. That is, the etching operation can be stabilized by controlling current density based on the detected current.

When the etching device 21 of FIG. 33 is used, a time period of several minutes is needed until temperature of the etching solution 14 reaches a target temperature (110° C.) after supplying the etching solution 114, which has been warmed by previously heating it, into the hermetically-sealed vessel and starting the etching operation. It is preferable that the etching operation is not progressed during the time period. Accordingly, for example, a voltage of about 1 V is applied to the Si wafer 111. Thereafter, it is preferable that, when temperature of the etching solution reaches the target temperature and is stabilized, current flowing in the Si wafer 111 is monitored by the current detector 116 and the applied voltage is adjusted in such a manner that the current density becomes a predetermined value (value mentioned later).

When the inclined face portion 150 is formed as described above, micro pyramids having the cross-sectional face in a substantially rhombic shape may be produced on the diaphragm face 152a of the Si diaphragm 152. Hence, relationship between the initial current density and the occurrence frequency of the micro pyramids is derived by an experiment. The result is the same as the characteristics shown by the graph of FIG. 24.

As a method of eliminating the micro pyramids, in view of FIG. 24, there is provided a method of etching the Si wafer 111 by about 50 μm while applying voltage of, for example, 0 through 0.15 V whereby the initial current density becomes 0.18 mA/mm$^2$ or lower. Hence, according to the sixth embodiment, when the micro pyramids occur, thereafter, the voltage of 0 through 0.15 V is applied and the etching is carried out so that the Si wafer is etched by about 50 μm, whereby the micro pyramids are eliminated. In this case, the etching may be carried out without applying voltage. Further, micro pyramids can be eliminated also by applying reverse voltage by switching the voltage polarity switching circuit 72 of the etching device 21.

An explanation will be given of etching control where the inclined face portion 150 is formed and the micro pyramids are eliminated. According to this etching control, by using the Si wafer 111 having the original thickness of, for example, 300 μm, the Si diaphragm 152 of 30 μm is formed. In this case, firstly, for example, the voltage of 1 V is applied as a first voltage and the Si wafer 111 is anodically oxidized for, for example, 10 minutes until the temperature of the etching solution is stabilized. Successively, when the voltage of 0.3 V is applied, the current value is monitored. The applied voltage is adjusted in such a manner that the current density becomes, for example, 0.21 mA/mm$^2$. Then, under the state of application of voltage, the etching operation is carried out for, for example, 24 minutes. Next, the applied voltage is changed to 0 V and the etching is carried out for, for example, 5.5 minutes. Thereafter, water is injected into the hermetically-sealed vessel (processing tank) of the etching device 21 and the etching is finished. In this case, the Si wafer 111 may again be anodically oxidized as necessary.

Further, by etching control as mentioned above, an Si diaphragm in an octagonal shape having the inclined face portion 150 where the projecting amount from (111) face is about 100 μm can be formed. In this case, the dimension of the projecting amount of the inclined face portion 150 can freely be controlled within a range of about 0 through 100 μm by adjusting the initial current density (applied voltage) in etching after temperature of the etching solution is stabilized.

Further, when the inclined face portion 150 having a small projecting amount, voltage may be controlled (to, for example, 0.1 V) in such a manner that the initial current density becomes 0.1 through 0.15 mA/mm$^2$ in the etching operation. Further, when such a voltage is applied, micro pyramids do not occur. Accordingly, voltage control for eliminating micro pyramids is dispensed with and etching control is simplified thereby. Incidentally, as the projecting amount of the inclined face portion 150 necessary for preventing stress concentration is sufficient to be about 5 μm.

Figure 54A:
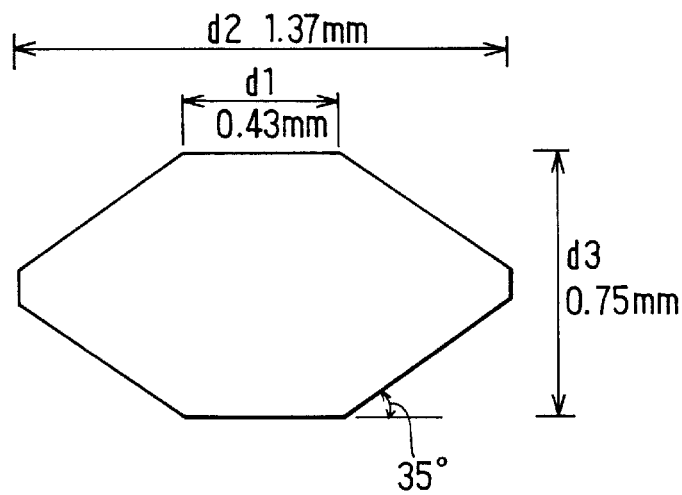
FIG. 54A is a top view of an etching mask.
Figure 54B:
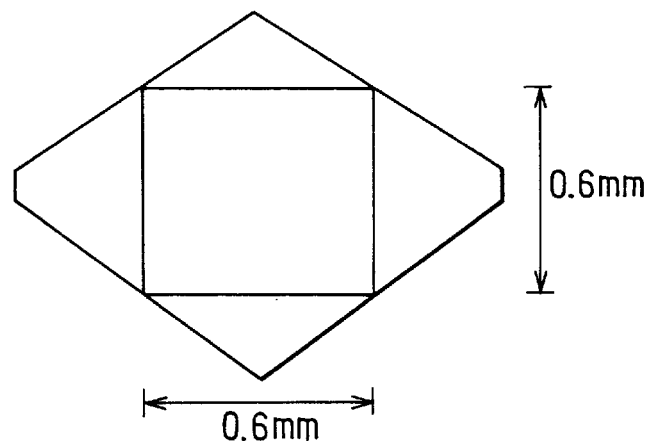
FIG. 54B is a top view of an Si diaphragm when etching is carried out by conventional technology and FIG. 54C is a top view of an Si diaphragm when etching is carried out in the sixth embodiment.
Figure 54C:
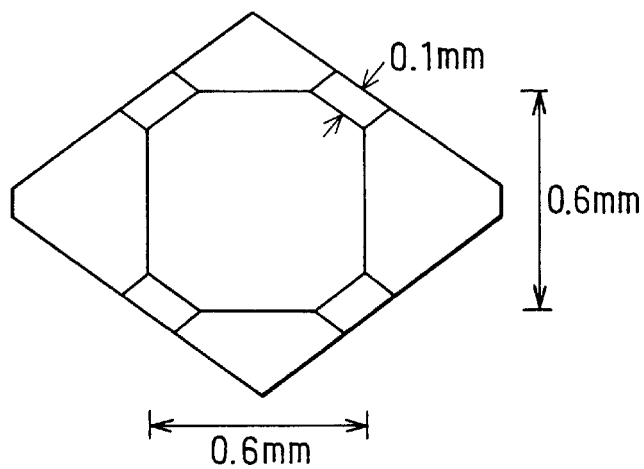
Figure 56:
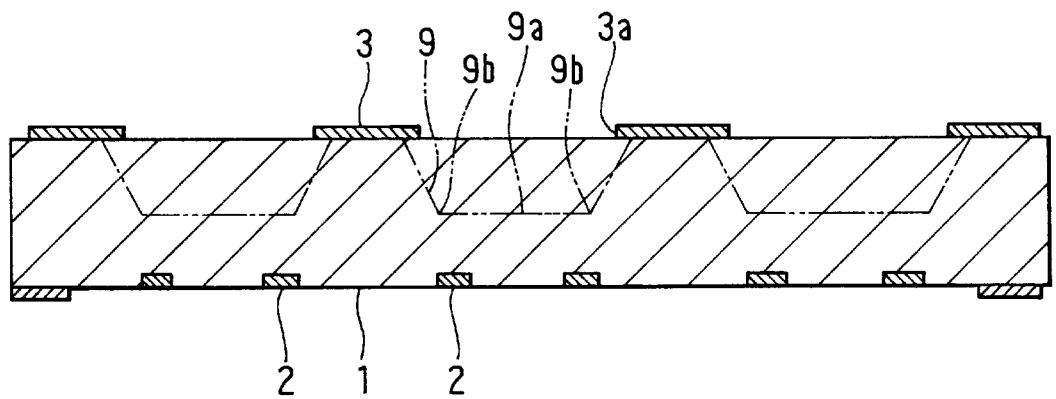
FIG. 56 is a sectional view of a conventional Si wafer.
Figure 57:
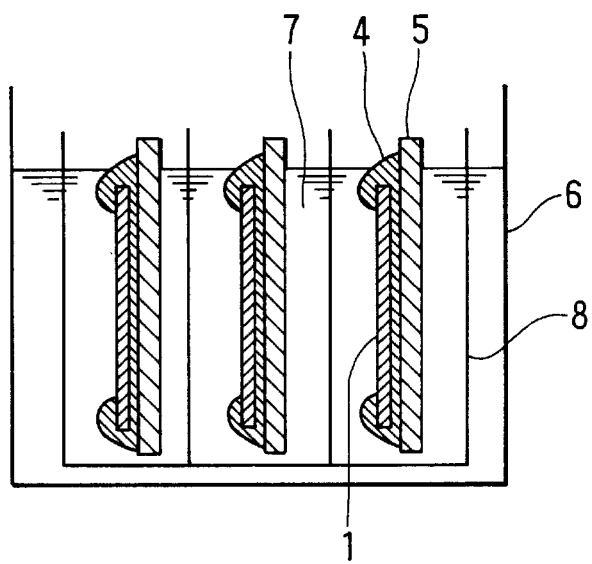
FIG. 57 is a schematic view of a conventional etching device.
Figure 60:
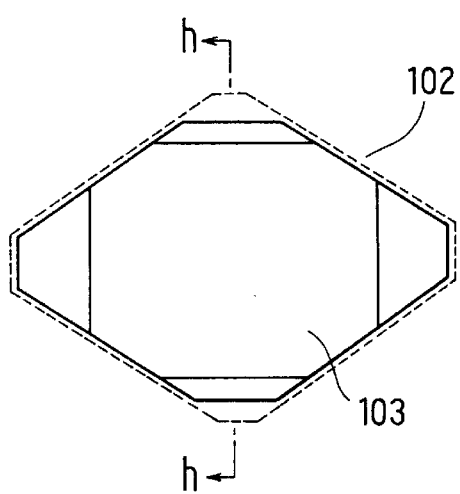
FIG. 60 is a top view of a conventional Si wafer after etching.

Meanwhile, in forming the Si diaphragm 152 in an octagonal shape, an etching mask having a shape as shown in FIG. 54A is used. Further, according to the conventional etching method where voltage is not applied in etching, when an Si diaphragm of 30 μm or less is formed in an Si wafer having the original thickness of 300 μm, an Si diaphragm having the dimension of a side of a diaphragm face equal to or less than 600 could not be formed. This is because the Si diaphragm becomes octagonal with a long breadth and a long height as shown in FIG. 54B however respective dimensions of d1, d2 and d3 of an etching mask shown in FIG. 54A is adjusted.

In contrast thereto, according to the sixth embodiment, a corner of a quadrangle can be eliminated by an amount of the inclined face portion 150. Accordingly, a small-sized Si diaphragm (refer to FIG. 54C) having a diaphragm thickness of 30 μm or less and a dimension of a side of a diaphragm face of 600 μm (0.6 mm) can be formed by using an Si wafer having the original thickness of 300 μm. Further, it has been confirmed that a small-sized octagonal Si diaphragm having a dimension of 500 μm can be formed. Therefore, the degree of freedom of design of an Si diaphragm is promoted according to the sixth embodiment.

(Seventh Embodiment)

Figure 55:
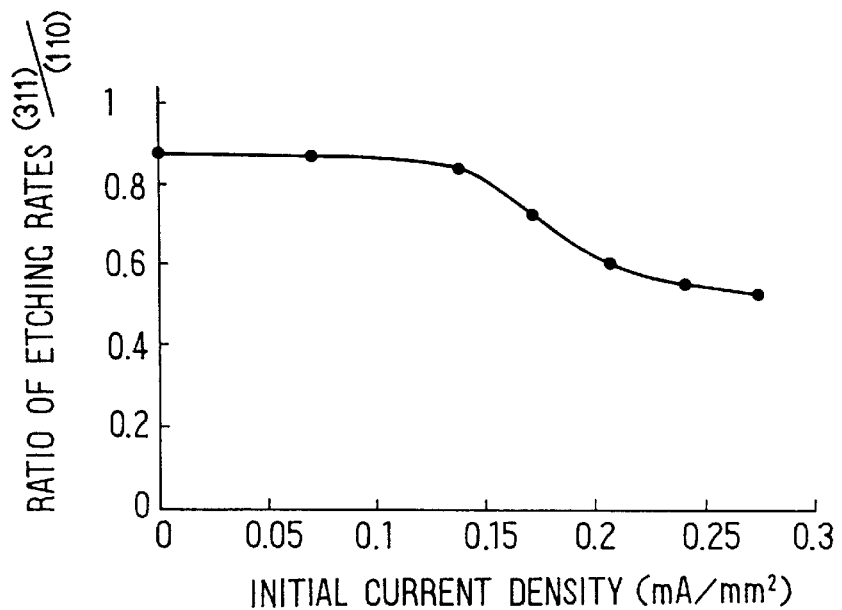
FIG. 55 is a diagram showing relationship between initial current density and a ratio of etching rates according to the sixth embodiment of the present invention.

In the seventh embodiment, etching is carried out in respect of an Si wafer of an N-type as shown in FIG. 30. In this case, as has been explained in the fifth embodiment, it is known from FIGS. 32A and 32B that the etching characteristic is changed by resistance in the power feeding circuit. Further, it is known that the etching characteristic in a voltage region where current changes substantially linearly with respect to the change of voltage is determined by current (density). Further, when relationship between the initial current density and the occurrence frequency of the micro pyramids in the case where the Si wafer 111 of an N-type is derived, the derived relationship is the same as that in FIG. 39. Furthermore, relationship between the initial current density and a ratio of an etching rate of the taper face of the inclined face portion 150 with respect to an etching rate of (110) face (that is, a ratio of the etching rates) is derived and the derived relationship is shown in FIG. 55.

It is known from FIGS. 32A and 32B, FIG. 39 and FIG. 55 that, when the Si wafer 111 of an N-type is etched, in order to form the inclined face portion 150 similar to that in the sixth embodiment by carrying out the etching operation in a state where resistance in the power feeding circuit is small, that is, in a state where the resistor 74 is not connected, a very small positive voltage near to 0 V must be applied. Further, it is known that in order to eliminate the micro pyramids, a very small negative voltage near to 0 V must be applied. It is considerably difficult to carry out such a fine voltage control with high accuracy. Hence, according to the seventh embodiment, the etching is carried out in a state where the resistor 74 is connected in series to the Si wafer 111 and the etching processing is can be realized only by applying positive voltage.

An explanation will be given of the conditions of etching where the Si diaphragm 152 having a thickness of 30 μm is formed by using the Si wafer 111 of an N-type having the original thickness of, for example, 300 μm. In this case, at first, in a state where the resistor 74 is not connected, that is, in a state where the switching element 73 is turned off and the switching element 75 is turned on, the voltage of, for example, 1 V is applied as the first voltage, and the Si wafer 111 is anodically oxidized for, for example, 10 minutes until temperature of the etching solution is stabilized. Successively, in the state is switched to a state where the resistor 74 is connected, that is, in a state where the switching element 73 is turned on and the switching element 75 is turned off, the voltage of, for example, 1.2 V is applied. At this time, the current value is monitored and the applied voltage is finely adjusted so that the current density becomes, for example, 0.21 mA/mm². Then, etching is carried out for, for example, 24 minutes under the state of application of voltage. Next, the voltage is changed to 0.2 V and etching is carried out for, for example, 5.5 minutes. Thereafter, water is injected into the hermetically-sealed vessel (processing tank) of the etching device 21 and the etching is finished. In this case, the Si wafer 111 may again be anodically oxidized if necessary.

By etching control as mentioned above, an Si diaphragm in an octagonal shape having the inclined face portion 150 where the projecting amount from (111) face is about 100 μm and having no micro pyramids on the diaphragm face, can be formed. Further, according to the seventh embodiment, by connecting the resistor 74, voltage control is carried out only by applying positive voltage and the variable range of voltage is widened. Accordingly, voltage control is simplified. It is to be noted that the constitution of the seventh embodiment other than above-described is the same as the constitution of the sixth embodiment.

Further, although, according to the above-described embodiment, connection of the resistor 74 is switched in the resistor connection switching circuit 71, the present invention is not limited thereto. For example, connection of a plurality of resistors may be switched. Further, it is preferable that resistance value of a resistor connected in series to the Si wafer 111 can be changed to a desired value.

Further, although, according to the above-described respective embodiments, the present invention is applied in the case where the Si wafer 111 having crystal orientation of (110) is etched the present invention is not limited thereto but can be applied to the case where an Si wafer of which crystal orientation is inclined slightly to (110) face is etched. A maximum of about 5° is conceivable as inclination. By the inclination, the angle of intersecting the taper face of the inclined face portion formed in the Si diaphragm with the diaphragm face is an angle in a range of 31.5°±5°, that is, 26.5° through 36.5°. Although the angle of inclination of the taper face of the inclined face portion is varied to the angle mentioned above, even in this case, stress can be prevented from concentrating on the peripheral edge portion (that is, end portion) of the diaphragm as less as possible.

What is claimed is:

1. A method of etching a silicon wafer by immersing the silicon wafer in an anisotropic etching solution, the method comprising;
   anisotropically etching a part of the silicon wafer to form a recess portion on the silicon wafer in an anisotropic etching solution, an entirety of the recess portion being contained in a single portion of the silicon wafer, the single portion having one conductivity type; and
   applying a voltage to the single portion directly for causing anodic oxidation simultaneously on at least two inner walls defining a corner of the recess portion, whereby the two inner walls of the recess portion are isotropically etched in the anisotropic etching solution.

2. A method of etching a silicon wafer according to claim 1, wherein the anisotropic etching solution is formed from KOH.

3. A method of etching a silicon wafer according to claim 1, further comprising:
   applying a voltage for causing anodic oxidation on the silicon wafer to prevent the silicon wafer from being anisotropically etched until temperature of the anisotropic etching solution becomes stable, before the silicon wafer is anisotropically etched to form the recess portion.

4. A method of etching a silicon wafer according to claim 1, wherein a bottom wall and side walls of the recess portion are all subjected to anodic oxidation.

5. A method of etching a silicon wafer according to claim 1, wherein applying a voltage includes applying said voltage to the two inner walls of the recess portion.

6. A method of etching a silicon wafer according to claim 1, wherein:
   the two inner walls is a bottom wall and a side wall of the recess portion, the side wall extending from the bottom wall to a surface of the silicon wafer; and
   an entire area of the side wall undergoes the anodic oxidation when the voltage is applied to the single portion.

7. A method of etching a silicon wafer according to claim 1, wherein, the silicon wafer is anisotropically etched while a voltage allowing anisotropic etching to progress on the silicon wafer is applied to the silicon wafer.

8. A method of etching a silicon wafer according to claim 7, wherein the voltage allowing anisotropic etching to progress on the silicon wafer is applied to the silicon wafer via a resistor connected in series to the silicon wafer.

9. A method of etching a silicon wafer according to claim 8, wherein resistance of the resistor is changed depending on a kind of the silicon wafer and a value of voltage that is applied to the silicon wafer.

10. A method of etching a silicon wafer according to claim 7, wherein the voltage applied to the silicon wafer is adjusted to effect the range of density of current flowing in the silicon wafer.

11. A method of etching a silicon wafer according to claim 10, wherein, when the silicon wafer that is etched is of a p-type, the range is from 0.1 mA/mm² to 0.2 mA/mm².

12. A method of etching a silicon wafer according to claim 10, wherein, when the silicon wafer that is etched is of a p-type, the range is from 0.12 mA/mm² to 0.18 mA/mm².

13. A method of etching a silicon wafer according to claim 10, wherein, when the silicon wafer that is etched is of an n-type, the range is from 0.07 mA/mm² to 0.17 mA/mm².

14. A method of etching a silicon wafer according to claim 1, wherein said anisotropically etching the silicon wafer includes anisotropically etching the silicon wafer having a crystal orientation of substantially (110) to form a diaphragm portion having an octagonal shape.

15. A method of etching a silicon wafer according to claim 14, wherein said anisotropically etching the silicon wafer includes applying a voltage to the silicon wafer so that the inclined face portions are formed between a diaphragm face of the diaphragm portion and four (111) faces orthogonal to the diaphragm face.

16. A method of etching a silicon wafer according to claim 15, wherein the voltage is adjusted so that the range of density of current flowing in the silicon wafer is effected.

17. A method of etching a silicon wafer according to claim 15, wherein the voltage applied to the silicon wafer is adjusted at least in two levels.

18. A method of etching a silicon wafer according to claim 17, wherein said anisotropically etching the silicon wafer comprises:
   applying a first voltage to the silicon wafer for forming the inclined face portions and
   applying a second voltage to the silicon wafer for eliminating micro pyramids on the diaphragm face, the second voltage being, different from the first voltage.

19. A method of etching a silicon wafer according to claim 18, wherein the first voltage is greater than the second voltage.

20. A method of etching a silicon wafer according to claim 18, wherein:
the first voltage is adjusted so that a density of current flowing in the silicon wafer is equal to or larger than 0.15 mA/mm$^2$; and
the second voltage is adjusted so that a density of current flowing in the silicon wafer is equal to or lower than 0.15 mA/mm$^2$.

21. A method of etching a silicon wafer according to claim 18, wherein:
the silicon wafer is anisotropically etched to have an etched wall and
the first voltage and the second voltages are applied to the etched wall of the silicon wafer.

22. A method of etching a silicon wafer according to claim 18, wherein the first voltage is changed to the second voltage so that a current density is decreased.

23. A method of etching a semiconductor wafer according to claim 22, wherein the isotropical etching is performed to an entire area of all of inner walls defining the recess portion while forming an oxide film on the entire area.

24. A method of etching a silicon wafer composed of a p-type layer and an n-type layer by immersing the silicon wafer in an anisotropic etching solution, the method comprising:
a step of anisotropically etching a part of the p-type layer by a predetermined depth;
a step of applying a first positive voltage to the n-type layer, whereby, when an etching face in the p-type layer makes contact with a depletion layer extending from a pn junction between the p-type layer and the n-type layer, the etching face contacting the depletion layer is subjected to anodic oxidation; and
a step of applying a second positive voltage to the p-type layer to cause anodic oxidation on the entire etching face of the p-type layer, whereby the entire etching face is isotropically etched in the anisotropic etching solution.

25. A method of etching a silicon wafer according to claim 24, wherein:
anisotropically etching the silicon wafer to have a recess portion thereon; and
isotropically etching at least two inner walls defining a corner of the recess portion by the first and second positive voltages respectively applied to the n-type layer and the p-type layer.

26. A method of etching a silicon wafer according to claim 24, wherein said applying the second positive voltage to the p-type layer comprises:
stopping the first positive voltage from being applied to the n-type layer and
applying the second positive voltage to the p-type layer.

27. A method of etching a silicon wafer according to claim 24, wherein, in the step of anisotropically etching a part of the p-type layer, a voltage allowing anisotropic etching to progress on the p-type layer is applied to the p-type layer.

28. A method of etching a silicon wafer according to claim 27, wherein the voltage allowing anisotropic etching is lower than the second positive voltage.

29. A method of etching a silicon wafer according to claim 27, wherein the voltage allowing anisotropic etching is in a range of approximately 0.1 to 0.2 mA/mm$^2$.

30. A silicon wafer, comprising;
a silicon diaphragm having an octagonal shape formed in the silicon wafer of which crystal orientation is substantially (110); and
four inclined face portions formed between a diaphragm face of the silicon diaphragm and four (111) faces orthogonal to the diaphragm face.

31. A silicon wafer according to claim 30, wherein an angle at which the inclined face portions and the diaphragm face is set to a range of 26.5° to 36.5°.

32. A silicon wafer according to claim 30, wherein the diaphragm is defined by a recess portion formed from a back face of the silicon wafer, and has a bottom face and a side face of the recess portion, the bottom face corresponding to the diaphragm face and to a (110) face of the silicon wafer.

33. A silicon wafer according to claim 32, wherein:
the bottom face of the recess portion has the octagonal shape; and
the side face includes four side faces inclined with respect to the bottom face and with respect to a direction perpendicular to the bottom face, and the four inclined face portions alternately disposed between the four side faces.

34. A silicon wafer according to claim 33, wherein the bottom face is surrounded by and directly connected to the four side faces and the four inclined face portions only.

35. A method of etching a silicon wafer, comprising;
immersing a silicon wafer in an anisotropic etching solution;
anisotropically etching the silicon wafer to form a recess portion on the silicon wafer, an entirety of the recess portion being contained in a single portion of the silicon wafer, the single portion having one conductivity type; and
isotropically etching at least two inner walls defining a corner of the recess portion in the anisotropic etching solution to round the corner by applying a voltage to the two inner walls having the one conductivity type directly.

36. A method of etching a silicon wafer according to claim 35, wherein: including a silicon single layer in the silicon wafer; forming the recess portion in the silicon single layer; and directly applying voltage to the silicon single layer to cause anodic oxidation.

37. A method of etching a silicon wafer according to claim 35, wherein: isotropically etching the two walls of the recess portion in the anisotropic etching solution the same as that in which the silicon wafer is anisotropically etched.

38. A method of etching a silicon wafer according to claim 35, wherein:
the two inner walls is a bottom wall and a side wall of the recess portion, the side wall extending from the bottom wall to a surface of the silicon wafer; and
an entire area of the side wall is isotropically etched when the voltage is applied to the two inner walls.

39. A method of etching a silicon wafer according to claim 35, wherein:
the silicon wafer is composed of an n type layer and a p type layer disposed on the n type layer;
the p type layer is the single portion in which the recess portion is formed by anisotropic etching; and
the voltage is directly applied to the p type layer.

40. A method of etching a silicon wafer according to claim 39, wherein:
when the silicon wafer is anisotropically etched, a first voltage is applied to the p type layer; and
a second voltage different from the first voltage is applied to the n type layer to cause anodic oxidation to a depletion layer extending from a pn junction between the p type layer and the n type layer when the depletion layer is exposed from the recess portion.

41. A method of etching a silicon wafer according to claim 35, wherein:
applying a first voltage to the silicon wafer thereby anisotropically etching the silicon wafer;
applying a second voltage larger than the first voltage to the silicon wafer isotropically etching the silicon wafer; wherein
isotropic etching of the silicon wafer is started only by increasing the first voltage to the second voltage.

42. A method of etching a silicon wafer according to claim 41, wherein the first voltage is in a range of approximately 0.1 to 0.2 mA/mm$^2$.

43. A method of etching a semiconductor wafer, comprising:
preparing a semiconductor wafer having a P type layer exposed on a surface of the semiconductor wafer and an N type layer, the P type layer and the N type layer forming a PN junction at a first depth of the silicon wafer;
anisotropically etching the P type layer to form, in the P type layer, a recess portion having a second depth shallower than the first depth; and
isotropically etching at least two inner walls defining a corner of the recess portion by applying a voltage to the P type layer.

44. A method of etching a semiconductor wafer according to claim 43, wherein the two inner walls is isotropically etched by applying the voltage to the P type layer directly.

45. A method of etching a semiconductor wafer according to claim 43, wherein the application of the voltage to the P type layer starts the isotropical etching of the two inner walls.

46. A method of etching a semiconductor wafer, comprising:
immersing a semiconductor wafer into an anisotropic etching solution;
anisotropically etching the semiconductor wafer to form a recess portion;
applying a voltage between the anisotropic etching solution and the semiconductor wafer to form an oxide film on an entire area of a bottom face and a side face defining the recess portion; and
etching the oxide film by the anisotropic etching solution to round a corner of the recess portion defined between the bottom face and the side face.

47. A method of etching a semiconductor wafer according to claim 46, wherein the oxide film is etched simultaneously when the voltage is applied between the etching solution and the semiconductor wafer to form the oxide film.

48. A method of etching a semiconductor wafer according to claim 46, wherein an entirety of the semiconductor wafer has one conductivity type.

49. A method of etching a semiconductor wafer according to claim 46, wherein an entirety of the recess portion is contained in a single portion of the semiconductor wafer, the single portion having one conductivity type.

* * * * *